(12) United States Patent
Nakamura

(10) Patent No.: US 9,190,354 B2
(45) Date of Patent: Nov. 17, 2015

(54) SEMICONDUCTOR DEVICE AND MANUFACTURING METHOD OF THE SAME

(71) Applicant: FUJITSU SEMICONDUCTOR LIMITED, Yokohama-shi, Kanagawa (JP)

(72) Inventor: Koichi Nakamura, Fuchu (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 14/157,714

(22) Filed: Jan. 17, 2014

(65) Prior Publication Data

US 2014/0217567 A1   Aug. 7, 2014

(30) Foreign Application Priority Data

Feb. 4, 2013   (JP) .................... 2013-019201

(51) Int. Cl.
*H01L 23/495*   (2006.01)
*H01L 21/56*   (2006.01)
(Continued)

(52) U.S. Cl.
CPC ........ *H01L 23/49575* (2013.01); *H01L 21/563* (2013.01); *H01L 23/3107* (2013.01); *H01L 24/13* (2013.01); *H01L 24/16* (2013.01); *H01L 24/32* (2013.01); *H01L 24/73* (2013.01); *H01L 24/92* (2013.01); *H01L 25/03* (2013.01); *H01L 24/03* (2013.01); *H01L 24/11* (2013.01); *H01L 24/29* (2013.01); *H01L 24/45* (2013.01); *H01L 24/48* (2013.01); *H01L 24/49* (2013.01); *H01L 24/81* (2013.01); *H01L 24/83* (2013.01); *H01L 24/85* (2013.01); *H01L 24/94* (2013.01); *H01L 25/18* (2013.01); *H01L 2224/0345* (2013.01); *H01L 2224/0361* (2013.01); *H01L 2224/03912* (2013.01); *H01L 2224/0401* (2013.01); *H01L 2224/1146* (2013.01); *H01L 2224/1147* (2013.10); *H01L 2224/11901* (2013.01); *H01L 2224/131* (2013.01); *H01L 2224/13023* (2013.01); *H01L 2224/13082* (2013.01); *H01L 2224/13111* (2013.01); *H01L 2224/13147* (2013.01); *H01L 2224/16145* (2013.01); (Continued)

(58) Field of Classification Search
CPC ... H01L 21/56; H01L 24/81; H01L 23/49575; H01L 21/563; H01L 23/3107
USPC .......................................... 257/676; 438/123
See application file for complete search history.

(56) References Cited

U.S. PATENT DOCUMENTS

2002/0030258 A1*   3/2002   Fukasawa et al. ............ 257/678
2006/0043641 A1*   3/2006   Kuratomi et al. ........ 264/272.17
(Continued)

FOREIGN PATENT DOCUMENTS

JP   2007-250906 A   9/2007
JP   2010-27848 A   2/2010
(Continued)

*Primary Examiner* — Walter H Swanson
(74) *Attorney, Agent, or Firm* — Westerman, Hattori, Daniels & Adrian, LLP

(57) ABSTRACT

A semiconductor package includes a semiconductor chip, a protruding pillar electrode provided on the semiconductor chip, and resin covering the semiconductor chip and the pillar electrode. The resin has a concave part and exposes a front edge portion of the pillar electrode from the resin at the bottom face of the concave part. The front edge portion of the pillar electrode is exposed from the concave part of the resin, which makes it possible to suppress increase in the height of the pillar electrode and to form the pillar electrodes having fine patterns or a narrow pitch.

11 Claims, 35 Drawing Sheets

(51) Int. Cl.
*H01L 23/00* (2006.01)
*H01L 23/31* (2006.01)
*H01L 25/03* (2006.01)
*H01L 25/18* (2006.01)

(52) U.S. Cl.
CPC ........... *H01L2224/16147* (2013.01); *H01L 2224/2919* (2013.01); *H01L 2224/2929* (2013.01); *H01L 2224/29339* (2013.01); *H01L 2224/32058* (2013.01); *H01L 2224/32145* (2013.01); *H01L 2224/32221* (2013.01); *H01L 2224/32225* (2013.01); *H01L 2224/32245* (2013.01); *H01L 2224/45124* (2013.01); *H01L 2224/45147* (2013.01); *H01L 2224/48091* (2013.01); *H01L 2224/48108* (2013.01); *H01L 2224/48227* (2013.01); *H01L 2224/48245* (2013.01); *H01L 2224/48247* (2013.01); *H01L 2224/49171* (2013.01); *H01L 2224/73204* (2013.01); *H01L 2224/73207* (2013.01); *H01L 2224/73253* (2013.01); *H01L 2224/73265* (2013.01); *H01L 2224/8113* (2013.01); *H01L 2224/8191* (2013.01); *H01L 2224/81193* (2013.01); *H01L 2224/81815* (2013.01); *H01L 2224/831* (2013.01); *H01L 2224/8385* (2013.01); *H01L 2224/83385* (2013.01); *H01L 2224/83447* (2013.01); *H01L 2224/83851* (2013.01); *H01L 2224/83862* (2013.01); *H01L 2224/85447* (2013.01); *H01L 2224/92* (2013.01); *H01L 2224/92163* (2013.01); *H01L 2224/92247* (2013.01); *H01L 2224/94* (2013.01)

(56) References Cited

U.S. PATENT DOCUMENTS

| | | | |
|---|---|---|---|
| 2007/0231956 A1* | 10/2007 | Fukaya et al. | 438/106 |
| 2011/0241165 A1* | 10/2011 | Nakashiba et al. | 257/531 |
| 2012/0193782 A1* | 8/2012 | Akamatsu | 257/737 |

FOREIGN PATENT DOCUMENTS

| | | |
|---|---|---|
| JP | 2010-73771 A | 4/2010 |
| JP | 2010-283021 A | 12/2010 |

* cited by examiner

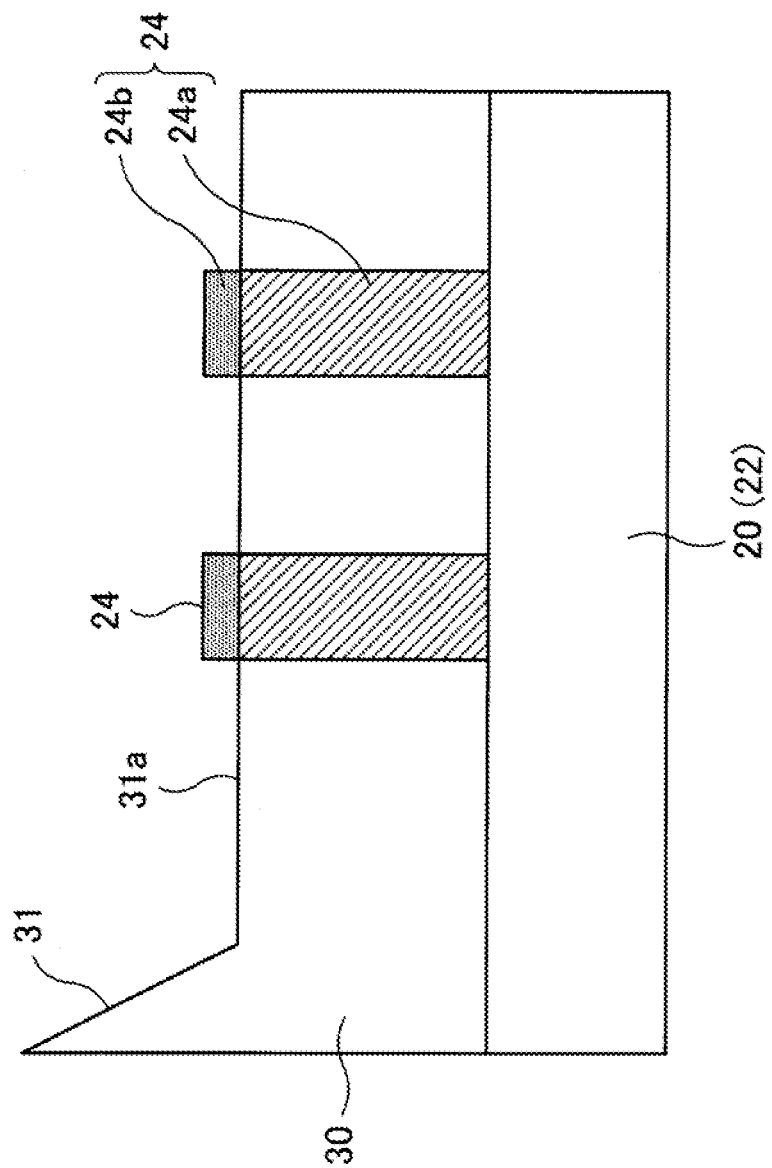

US 9,190,354 B2

SEMICONDUCTOR DEVICE AND MANUFACTURING METHOD OF THE SAME

CROSS-REFERENCE TO RELATED APPLICATION

This application is based upon and claims the benefit of priority of the prior Japanese Patent Application No. 2013-019201, filed on Feb. 4, 2013, the entire contents are incorporated herein by reference.

FIELD

The embodiments discussed herein relate to semiconductor devices and manufacturing methods of the same.

BACKGROUND

For a semiconductor device provided with a semiconductor chip, there is known a technique of encapsulating the semiconductor chip mounted on a lead frame or a circuit substrate with resin. For the semiconductor chip encapsulated with the resin in this manner, there is also known a technique of providing a protruding electrode (also called a post, pillar, columnar electrode, or the like) having an apical surface thereof exposed from the resin (for example, see Japanese Laid-Open Patent Publication No. 2010-027848). Further, there is also known a technique of flip-chip connecting another semiconductor chip onto the semiconductor device which is provided with the protruding electrode having the apical surface exposed from the resin in this manner, utilizing this exposed protruding electrode (for example, see Japanese Laid-Open Patent Publication No. 2007-250906).

Further, for the semiconductor device provided with the semiconductor chip, there are known a technique of incorporating the semiconductor chip in the circuit substrate (for example, see Japanese Laid-Open Patent Publication No. 2010-073771), and a technique of flip-chip connecting another semiconductor chip utilizing a conductor part provided on the incorporated semiconductor chip, for example, the protruding electrode or a wiring (for example, see Japanese Laid-Open Patent Publication No. 2010-283021).

When the protruding electrode is provided in this manner having the apical surface exposed from the resin which encapsulates the semiconductor chip, it is preferable to provide the protruding electrode having such a height as to expose the apical surface from the resin, according to the thickness of the resin provided on the arrangement surface side of the protruding electrode.

While the protruding electrode is formed by the use of a plating method, for example, when the protruding electrode having a large height is to be provided, there arises a problem of consuming a long time for forming the protruding electrode or a problem of inviting increase in manufacturing and material cost of the semiconductor chip provided with the protruding electrode and the semiconductor device provided with this semiconductor chip. Further, when thickness is increased in resist used as a mask in the formation of the protruding electrode, there might arise a problem that it becomes difficult to form a fine pattern in the resist, it is not possible to provide a fine protruding electrode, and it is not possible to provide the plural protruding electrodes at a narrow pitch.

SUMMARY

According to an aspect of the embodiments, there is provided a semiconductor device including: a first substrate, resin covering the first substrate, a concave part provided in the resin, and a first electrode with a protruding shape, which is provided on the first substrate and includes a part exposed from the resin at the bottom face of the concave part.

The object and advantages of the invention will be realized and attained by means of the elements and combinations particularly pointed out in the claims.

It is to be understood that both the foregoing general description and the following detailed description are explanatory and are not restrictive of the invention.

BRIEF DESCRIPTION OF DRAWINGS

FIG. 2 illustrates an example of the X part of FIG. 1;

DESCRIPTION OF EMBODIMENTS

Figure 1:
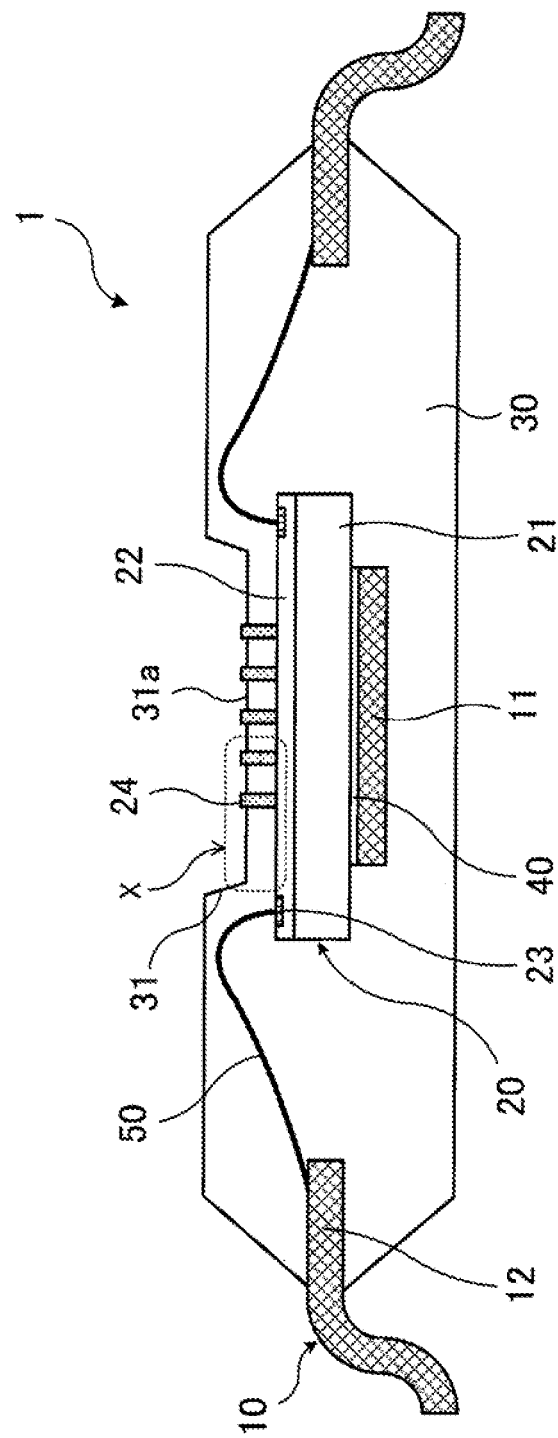
FIG. 1 illustrates an example of a semiconductor package according to a first embodiment.

Several embodiments will be described below in detail with reference to the accompanying drawings, wherein like reference numerals refer to like elements throughout.

First, a first embodiment will be explained.

FIG. 1 illustrates an example of a semiconductor package according to the first embodiment. Here, FIG. 1 is a schematic cross-sectional view of an example of the semiconductor package according to the first embodiment. Further, FIG. 2 illustrates an example of the X part of FIG. 1.

FIG. 1 illustrates a surface-mount type semiconductor package (semiconductor device) 1 such as a QFP (Quad Flat Package), as an example. The semiconductor package 1 illustrated in FIG. 1 includes a lead frame 10 and a semiconductor chip 20 (semiconductor element) mounted on the lead frame 10. The lead frame 10 and the semiconductor chip 20 are covered by resin 30.

The lead frame 10 has a die bonding stage 11 and a lead terminal 12. For the lead frame 10, there may be used metal material such as copper (Cu) or material containing Cu, for example. The semiconductor chip 20 is bonded to and mounted on the die bonding stage 11 of the lead frame 10 as described above by the use of die bonding material 40. For the die bonding material 40, there may be used resin material such as epoxy resin and polyimide resin, conductive paste containing filler made of silver (Ag) or the like, a conductive sheet, or the like.

The semiconductor chip 20 has a semiconductor substrate 21 where an element such as a transistor is formed, and a wiring layer 22 which is formed on the semiconductor substrate 21 and includes conductor parts (wiring and via) connected electrically to the element such as the transistor. On the surface of the wiring layer 22, plural electrode pads 23 and plural pillar electrodes 24 are provided, connected electrically to the conductor parts inside the wiring layer 22. The electrode pads 23 are provided in the circumferential part of the wiring layer 22 and the pillar electrodes 24 are provided in an inner region than the circumferential part of the wiring layer 22 where the electrode pads 23 are provided.

The lead frame 10 is connected electrically to the semiconductor chip 20 mounted on the die bonding stage 11 thereof, with the lead terminal 12 and the electrode pad 23 being connected to each other by a wire 50. For the wire 50, there may be used a Cu wire or a wire mainly containing Cu, an aluminum (Al) wire or a wire mainly containing Al, or the like.

The pillar electrode 24 of the semiconductor chip 20 may have a multilayer structure. For example, the pillar electrode 24 has an electrode part 24a which is provided protruding on the wiring layer 22, and a solder part 24b which is provided on the upper surface of this electrode part 24a, as illustrated in FIG. 2. For the electrode part 24a, there may be used metal material, for example, Cu or material containing Cu. For the solder part 24b, for example, there may be used, in addition to tin (Sn), solder material mainly containing Sn such as Sn—Ag, Sn—In—Ag, and Sn—Pb which contain Ag, indium (In), and lead (Pb), for example.

Note that, while the case of providing the solder part 24b on the electrode part 24a is illustrated here, also a layer using conductive material except the solder may be provided on the electrode part 24a. Further, the pillar electrode 24 may have a structure in which the solder part 24b is not provided on the electrode part 24a.

The resin 30 is provided so as to cover the lead frame 10 except a part of the lead terminal 12, the semiconductor chip 20 mounted on the lead frame 10, and the wire 50 connecting the lead frame 10 and the semiconductor chip 20. For the resin 30, there may be used material utilized as encapsulating resin, for example, resin material such as epoxy resin and resin material containing non-conductive filler made of silica or the like. The resin 30 may be a resin composition in which non-conductive filler is contained in the resin material, in addition to a resin composition containing mainly the resin material.

In the resin 30, a concave part 31 is provided above a region where the pillar electrodes 24 are provided of the semiconductor chip 20. The concave part 31 is provided so as to expose at least the upper surfaces of the pillar electrodes 24 from the resin 30 at the bottom face 31a thereof. For example, as illustrated in FIG. 2, the concave part 31 is provided so as to expose the upper surface and the side surface of the solder part 24b of the pillar electrode 24 from the resin 30 at the bottom face 31a.

The wire 50 connecting the electrode pad 23 outside the pillar electrode 24 and the lead terminal 12 is covered by the resin 30 having the concave part 31 as described above. The wire 50 covered by the resin 30 may have the upper end thereof at a higher position than the bottom face 31a of the concave part 31 or at a higher position than the pillar electrode 24. By providing the concave part 31 in the resin 30, it becomes possible to provide the pillar electrode 24 having a comparatively small height, while covering the wire 50 by the rein 30.

Here, the concave part 31 also may be provided in the resin 30 as illustrated in FIG. 3A, 3B, 3C, or 3D.

FIGS. 3A, 3B, 3C, and 3D illustrate other examples of the X part of FIG. 1.

Figure 3A:
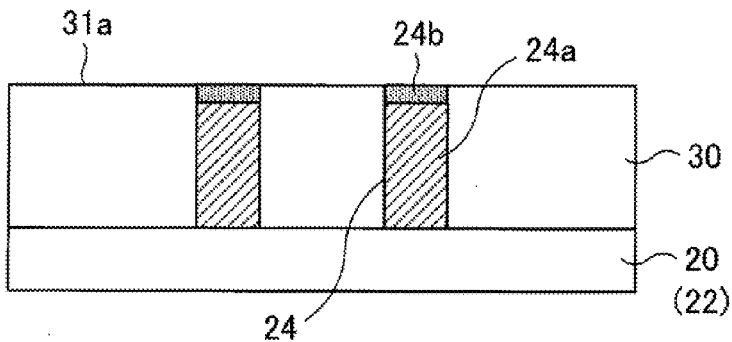
FIGS. 3A, 3B, 3C, and 3D illustrate other examples of the X part of FIG. 1.
Figure 3B:
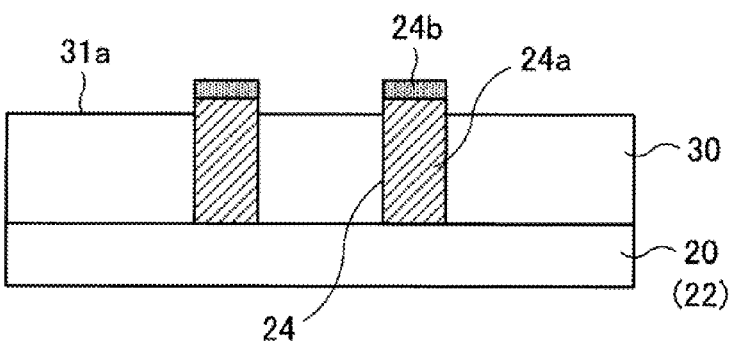

The concave part 31 also may be provided in the resin 30 so as to expose mainly the upper surface of the solder part 24b of the pillar electrode 24 at the bottom face 31a of the concave part 31, as illustrated in FIG. 3A. In addition, the concave part 31 also may be provided in the resin 30 so as to expose the solder part 24b and a part of the side face of the electrode part 24a of the pillar electrode 24 at the bottom face 31a of the concave part 31 as illustrated in FIG. 3B.

Figure 3C:
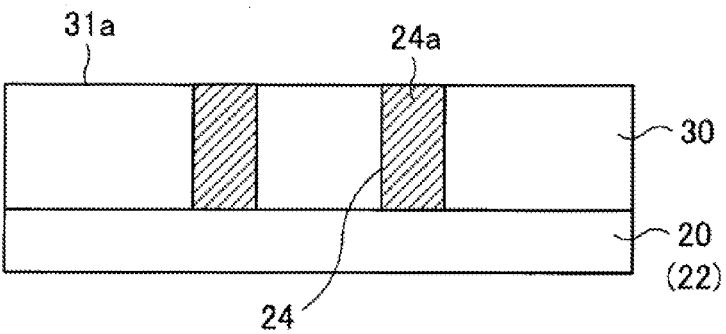
Figure 3D:
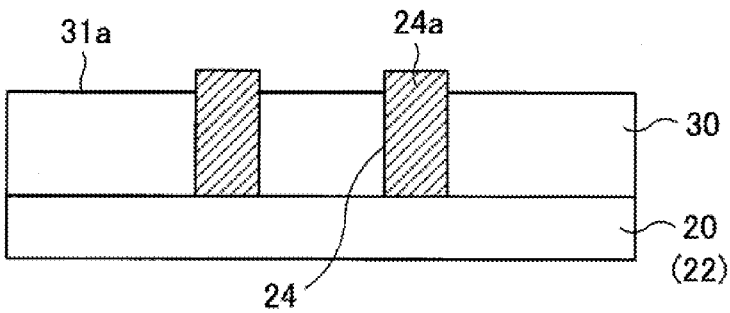

Further, when the pillar electrode 24 has a structure without providing the solder part 24b, the concave part 31 may be provided as illustrated in FIG. 3C or FIG. 3D. That is, as illustrated in FIG. 3C, the concave part 31 may be provided in the resin 30 so as to expose mainly the upper surface of the electrode part 24a at the bottom face 31a of the concave part 31. In addition, as illustrated in FIG. 3D, the concave part 31 also may be provided in the resin 30 so as to expose the upper surface and a part of the side face of the electrode part 24a at the bottom face 31a of the concave part 31.

The semiconductor package 1 as described above may be formed by the following method, for example.

FIG. 4, FIG. 5, FIG. 6, FIG. 7, FIG. 8, FIG. 9, FIG. 10, FIG. 11, FIGS. 12A, 12B, and 12C, and FIGS. 13A and 13B illustrate an example of a semiconductor package formation method according to the first embodiment.

First, an example of a formation method of the semiconductor chip 20 will be explained with reference to FIG. 4 to FIG. 9.

Figure 4:
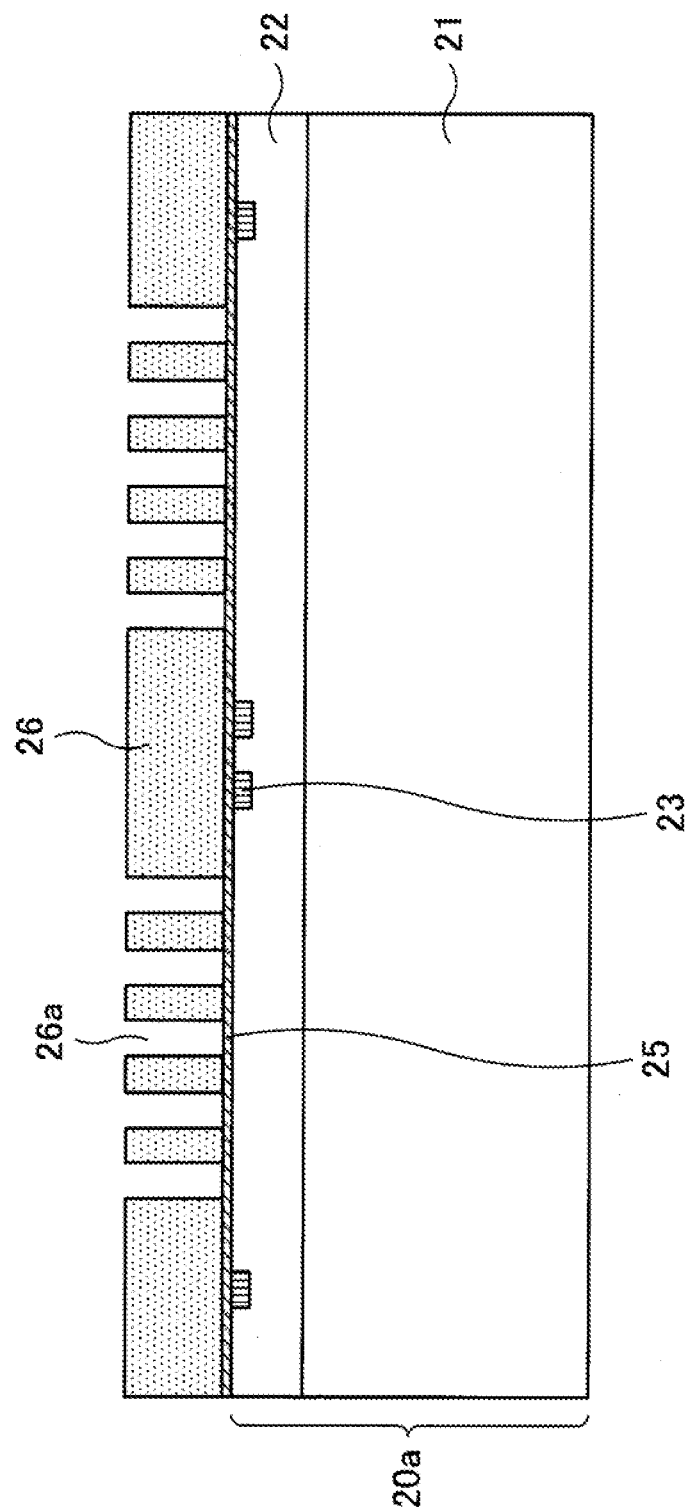
FIG. 4 is a diagram (part 1) illustrating an example of a semiconductor package formation method according to the first embodiment.

As illustrated in FIG. 4, there is prepared a substrate 20a, wherein the wiring layer 22 is formed on the semiconductor substrate 21 in which an element such as a transistor is formed, including the conductor parts (wiring and via) connected electrically to the element. Here, as an example, the substrate 20a is assumed to include plural structural parts (structural parts corresponding to individual semiconductor chips 20) which are to be divided into pieces as the semiconductor chips 20 in a dicing step (FIG. 9) to be described below. Here, the substrate 20a also may have a configuration including mainly a structural part corresponding to one semiconductor chip 20. On the wiring layer 22 of the prepared substrate 20a, a seed layer 25 is formed by the use of a sputtering method, for example. Successively, resist material is applied, exposed and developed, to form a resist 26 having an opening part 26a in a region where the pillar electrodes 24 are to be formed.

Figure 5:
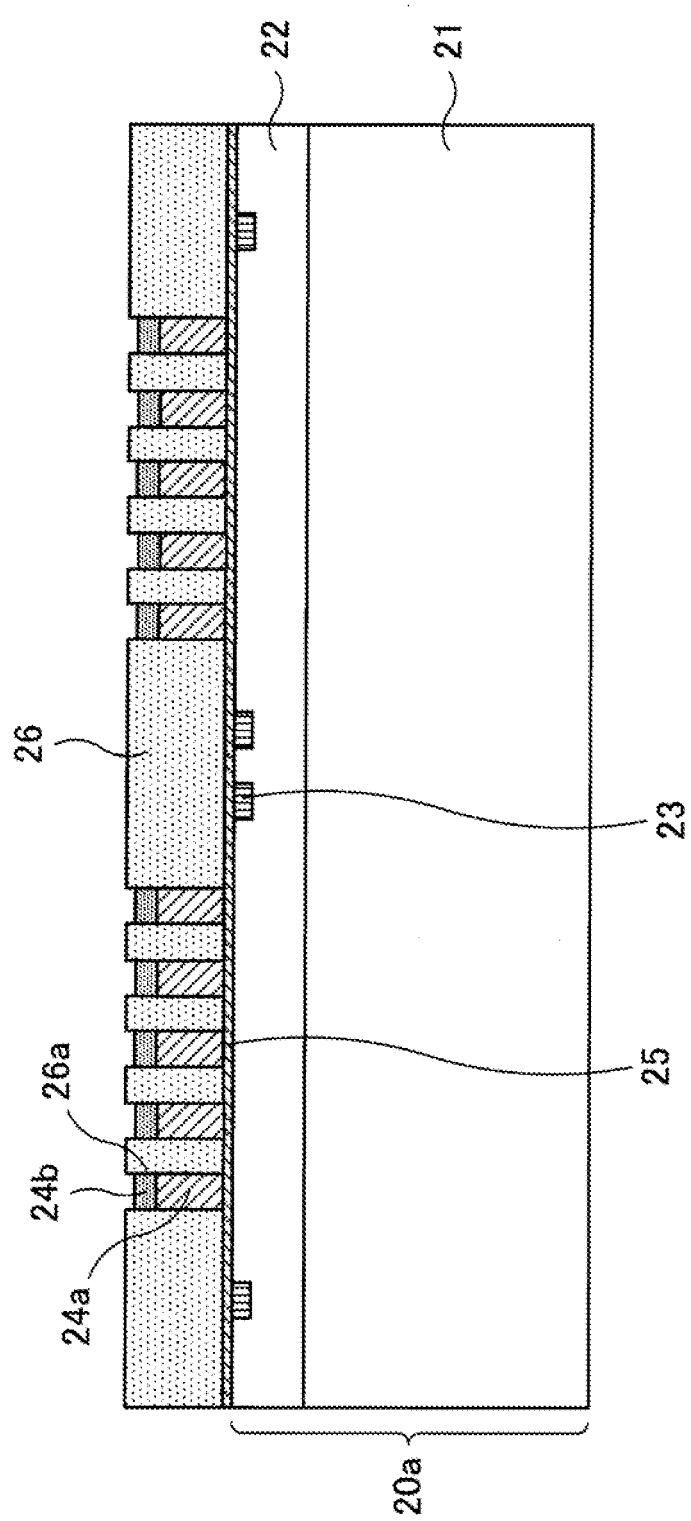
FIG. 5 is a diagram (part 2) illustrating an example of a semiconductor package formation method according to the first embodiment.

After the formation of the resist 26, as illustrated in FIG. 5, metal material such as Cu is deposited within the opening part 26a by the use of a plating method to form the electrode part 24a. Further, as illustrated in FIG. 5, solder material is deposited on the formed electrode part 24a by the use of a plating method to form the solder part 24b. Note that, when the solder part 24b is not provided for the pillar electrode 24, it is possible to omit the formation step of the solder part 24b as illustrated in this FIG. 5.

Figure 6:
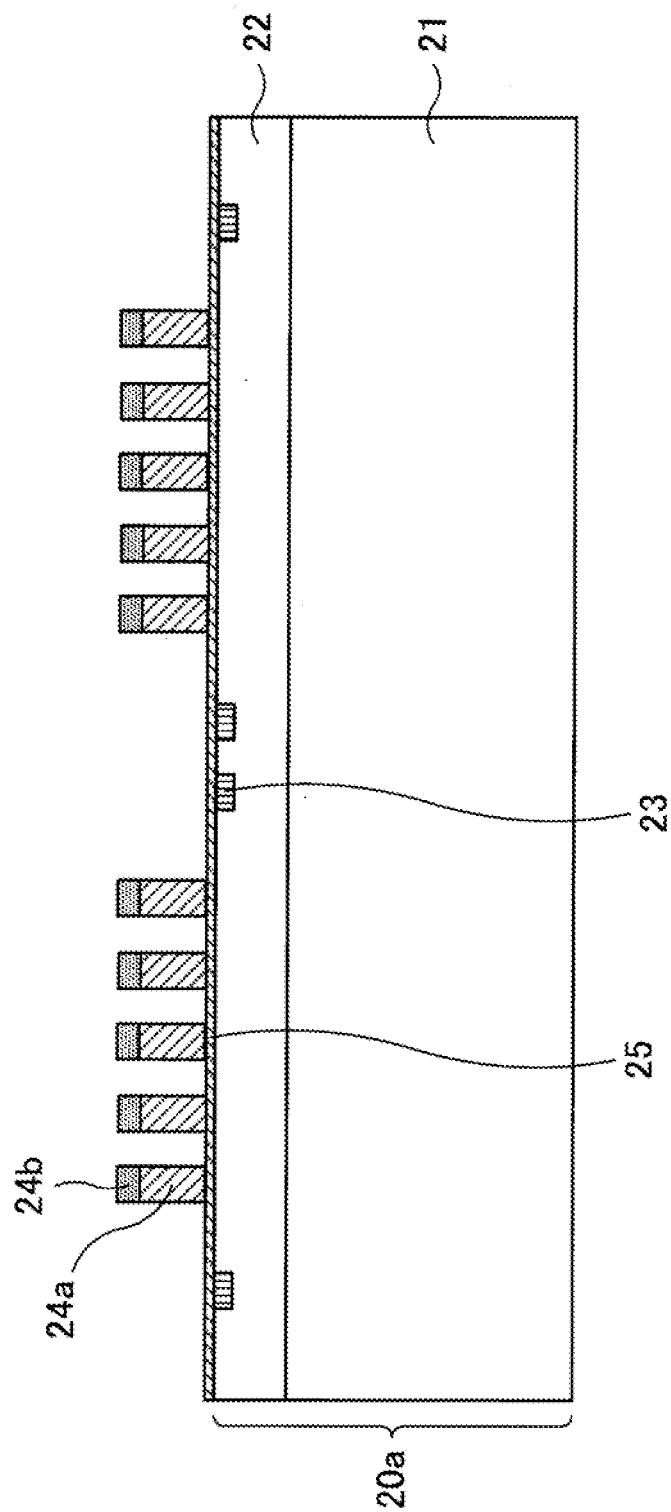
FIG. 6 is a diagram (part 3) illustrating an example of a semiconductor package formation method according to the first embodiment.
Figure 7:
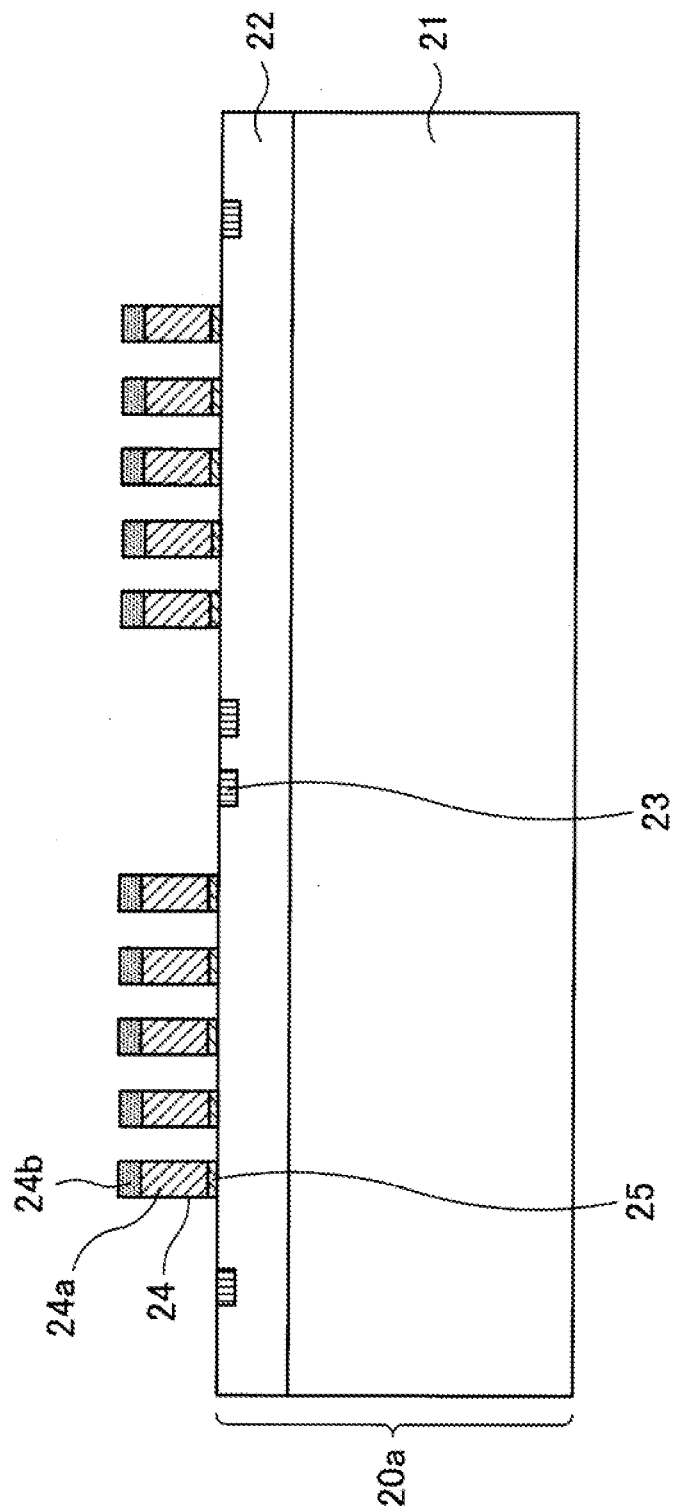
FIG. 7 is a diagram (part 4) illustrating an example of a semiconductor package formation method according to the first embodiment.

After the formation of the electrode part 24a and the solder part 24b, as illustrated in FIG. 6, the resist 26 is removed. Then, the seed layer 25, which is exposed after the removal of the resist 26, is removed by etching, and the substrate 20a, on which the pillar electrodes 24 are formed, is obtained as illustrated in FIG. 7.

Figure 8:
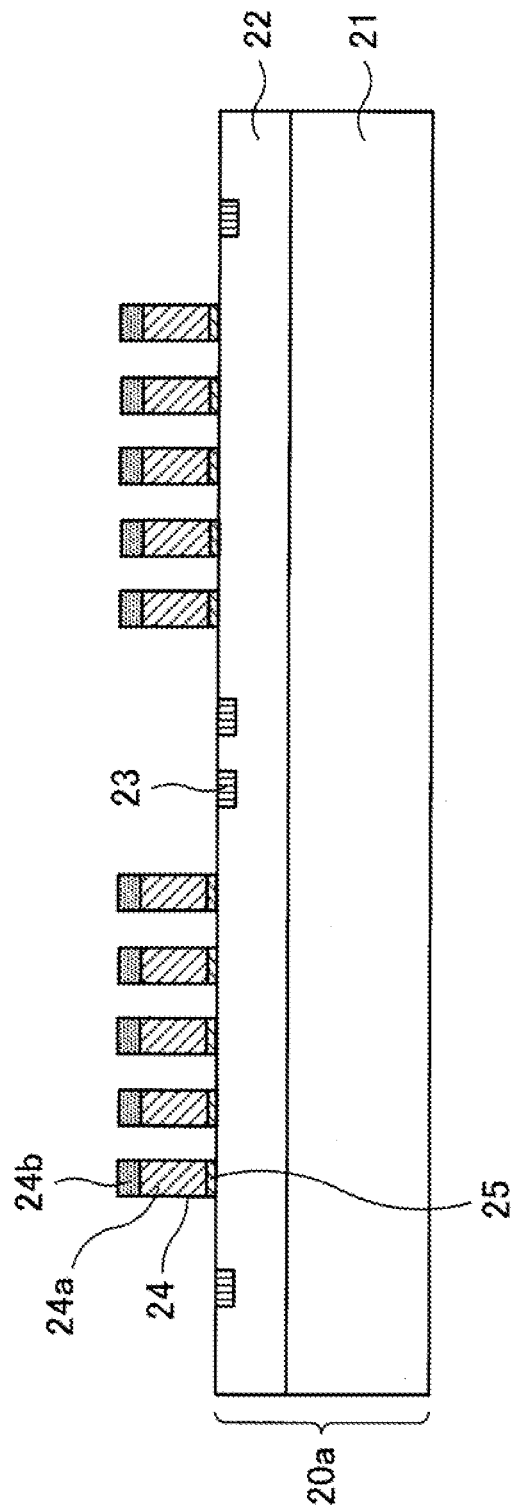
FIG. 8 is a diagram (part 5) illustrating an example of a semiconductor package formation method according to the first embodiment.

After the formation of the pillar electrodes 24 on the substrate 20a in this manner, as illustrated in FIG. 8, the substrate 20a is polished from the side of the semiconductor substrate 21 to be thinned (back-grind). After that, the substrate 20a is diced at desired positions (positions around the structural part corresponding to the individual semiconductor chip 20) to be divided into pieces of the individual semiconductor chips 20 as illustrated in FIG. 9.

In this manner, the semiconductor chip 20 is obtained, provided with the pillar electrodes 24.

Successively, there will be explained an example of the formation method of the semiconductor package 1 using the semiconductor chip 20 with reference to FIG. 10, FIG. 11, FIGS. 12A, 12B, and 12C, and FIGS. 13A and 13B.

Figure 9:
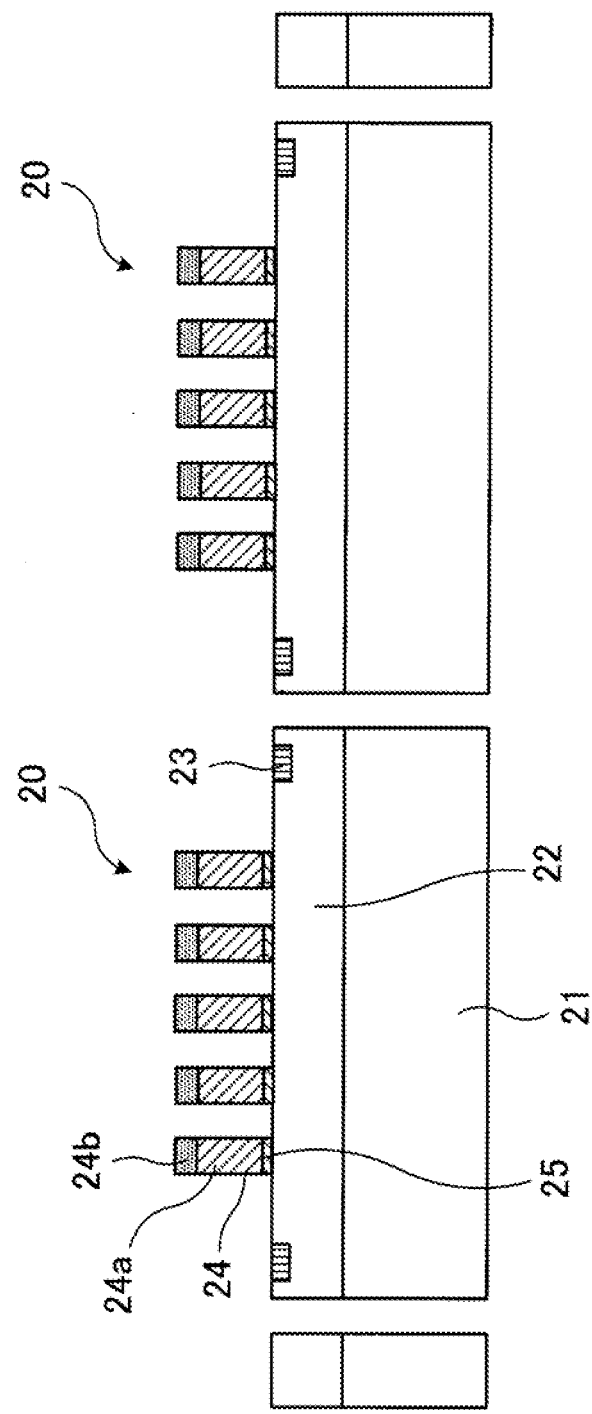
FIG. 9 is a diagram (part 6) illustrating an example of a semiconductor package formation method according to the first embodiment.
Figure 10:
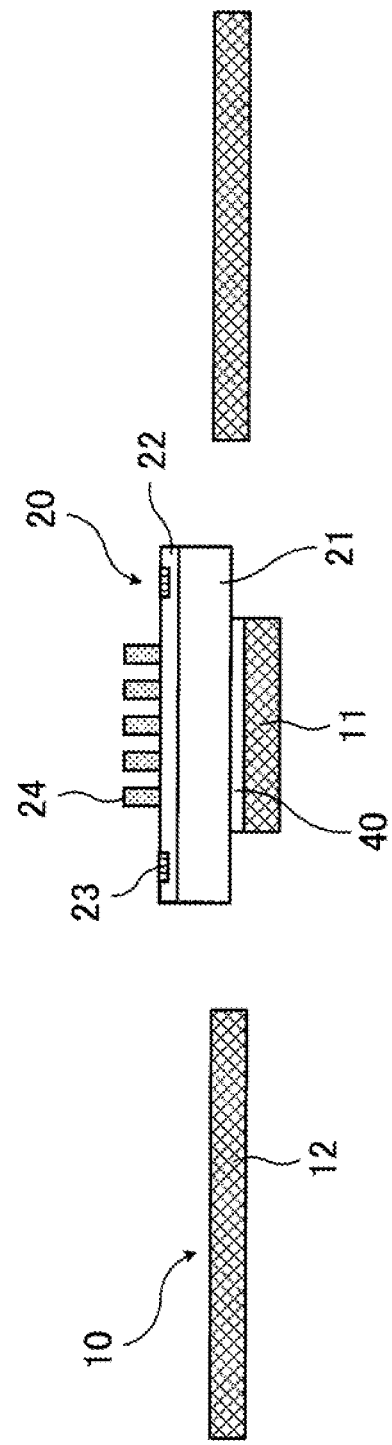
FIG. 10 is a diagram (part 7) illustrating an example of a semiconductor package formation method according to the first embodiment.

The semiconductor chip 20 obtained in the above step of FIG. 9 is mounted on the die bonding stage 11 by the use of the die bonding material 40, with the side of the semiconductor substrate 21 facing the die bonding stage 11 of the lead frame 10, as illustrated in FIG. 10.

Figure 11:
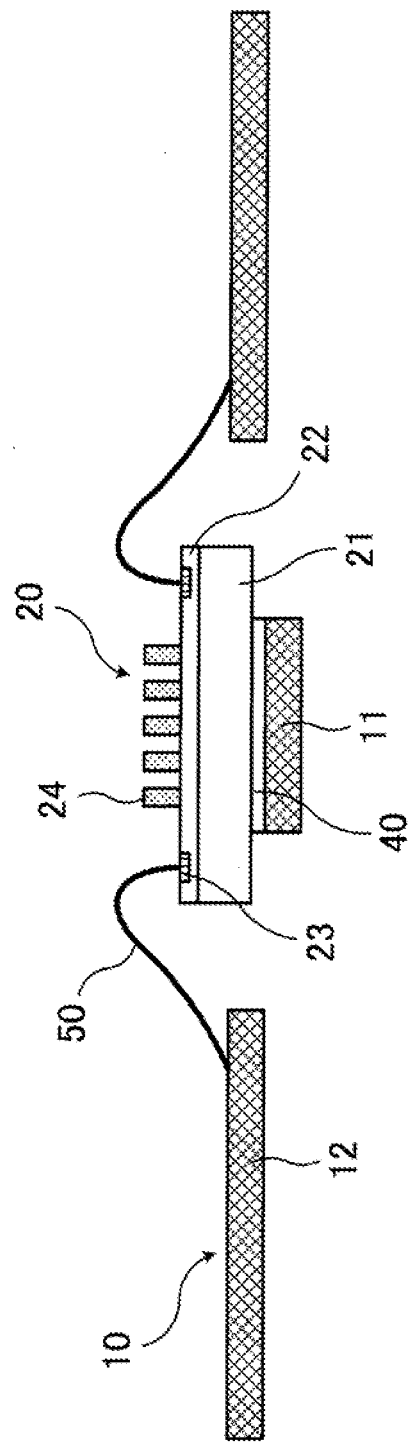
FIG. 11 is a diagram (part 8) illustrating an example of a semiconductor package formation method according to the first embodiment.

After the semiconductor chip 20 is mounted on the lead frame 10, the electrode pad 23 of the semiconductor chip 20 and the lead terminal 12 of the lead frame 10 are connected by the wire 50 as illustrated in FIG. 11.

Then, after the connection by the wire 50, the resin 30 is formed having the concave part 31 so as to expose a desired portion of the pillar electrode 24. The resin 30 having the concave part 31 as described above may be formed by the use of a method as illustrated in FIGS. 12A, 12B, and 12C, or FIGS. 13A and 13B, for example.

Figure 12A:
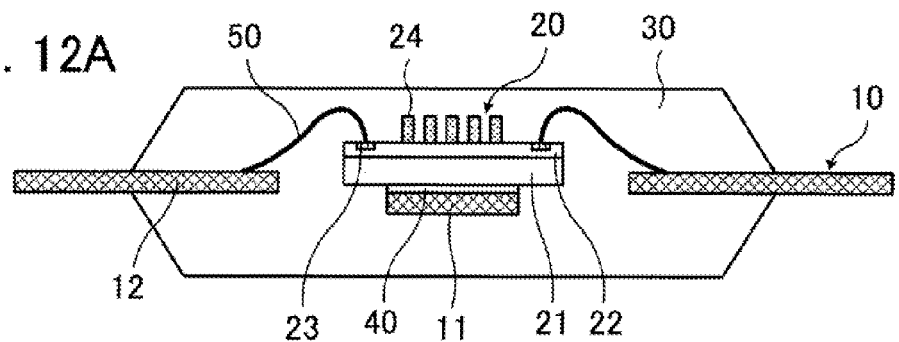
FIGS. 12A, 12B, and 12C are diagrams (part 9) illustrating an example of a semiconductor package formation method according to the first embodiment.
Figure 12B:
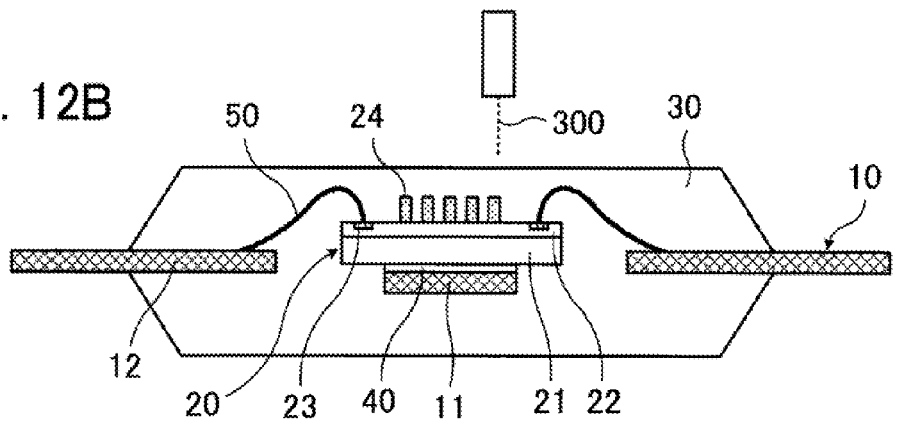
Figure 12C:
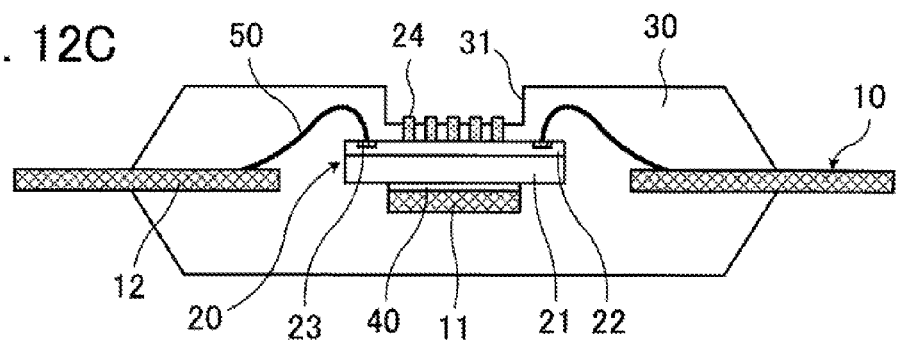

In the method illustrated in FIGS. 12A, 12B, and 12C, first, as illustrated in FIG. 12A, the resin 30 is formed to cover the lead frame 10 except a part of the lead terminal 12, the semiconductor chip 20 mounted on the lead frame 10, and the wire 50 connecting the lead frame 10 and the semiconductor chip 20. In this step of FIG. 12A, the resin 30 is formed by mold forming using a metal mold so as to cover the whole pillar electrodes 24 of the semiconductor chip 20. Successively, as illustrated in FIG. 12B, the resin 30 is irradiated with a laser 300 in a part corresponding to a region where the pillar electrodes 24 of the semiconductor chip 20 are provided. A YAG (Yttrium Aluminum Garnet) laser or the like may be used for the laser 300. By the irradiation of the laser 300 onto the resin 30, as illustrated in FIG. 12C, the resin 30 is removed in the irradiated part thereof and the desired portion of the pillar electrode 24 is exposed.

Figure 13A:
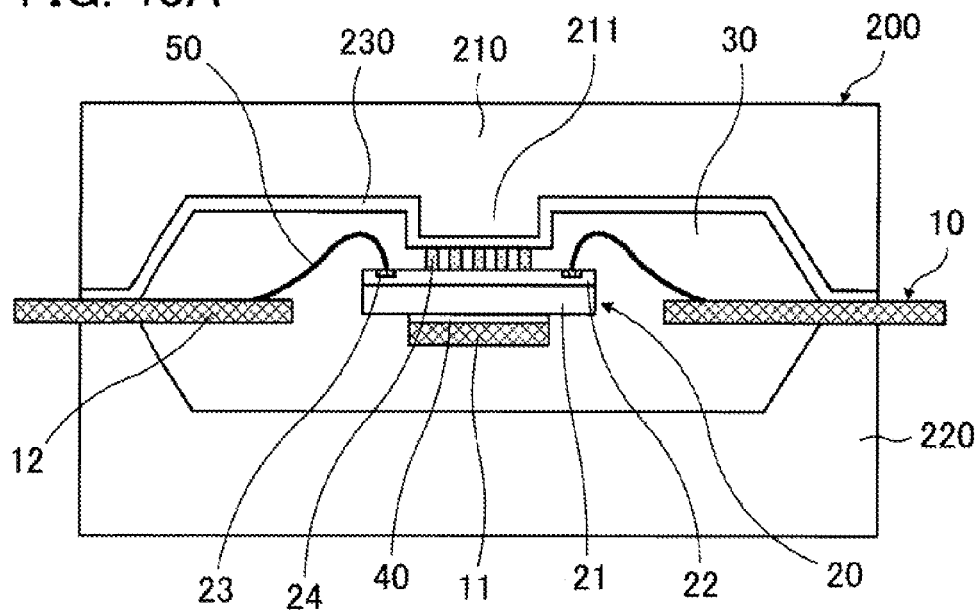
FIGS. 13A and 13B are diagrams (part 10) illustrating an example of a semiconductor package formation method according to the first embodiment.
Figure 13B:
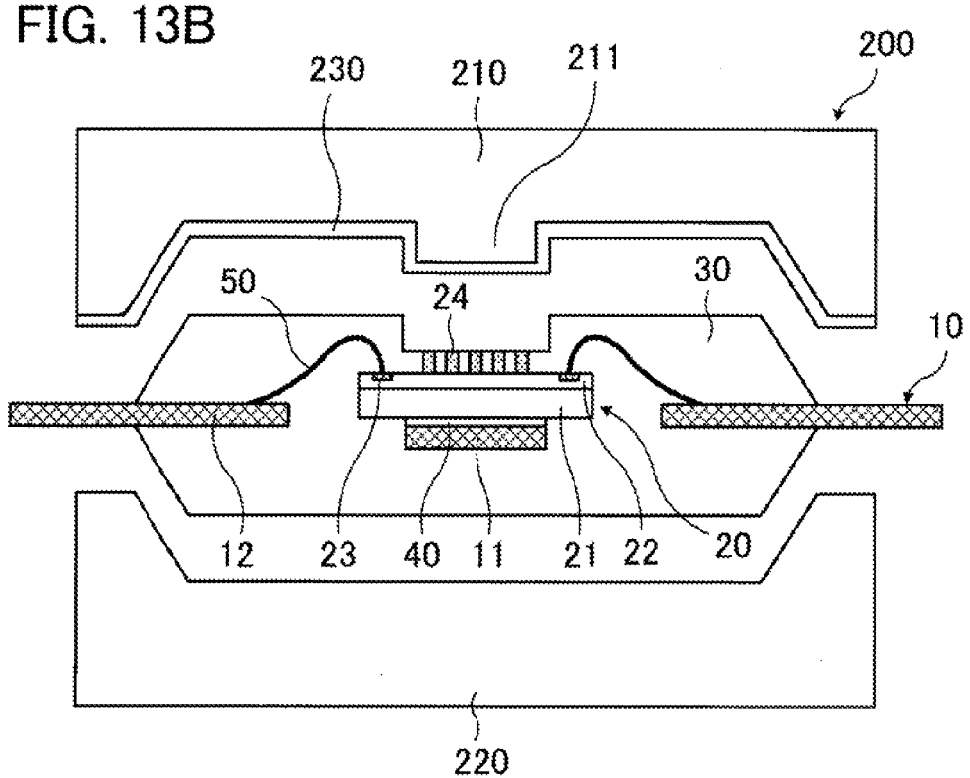

Further, in the method illustrated in FIGS. 13A and 13B, a convex part 211 which corresponds to the concave part 31 to be provided in the resin 30 is provided on the upper mold 210 of the metal mold 200 (upper mold 210 and lower mold 220) to be used in the mold forming as illustrated in FIG. 13A. The height of the convex part 211 is set according to the height of the pillar electrode 24. In the mold forming, a release film 230 is provided on the inner face (face providing the convex part 211) of the upper mold 210, and the mold forming is performed with this release film 230 brought into contact with the pillar electrodes 24. Thereby, as illustrated in FIG. 13B, in the resin 30 of the semiconductor package 1 taken out from the upper mold 210 provided with the release film 230 and the lower mold 220, the concave part 31 is provided exposing the upper surface of the pillar electrode 24. When the resin 30 adheres to the upper surface of the pillar electrode 24 after the mold forming using the metal mold 200, the upper surface of the pillar electrode 24 may be exposed by irradiation of the laser 300 as described above. Further, the upper surface and a part of the side face of the pillar electrode 24 may be exposed by the irradiation of the laser 300 onto the resin 30 as described above after the mold forming using the metal mold 200.

When the pillar electrode 24 has the configuration in which the solder part 24b is provided on the electrode part 24a of Cu or the like, the solder part 24b is able to suppress damage which may be caused in the electrode part 24a by the irradiation of the laser 300 (FIGS. 12A, 12B, and 12C) or the contact with the convex part 211 (FIGS. 13A and 13B). By providing the solder part 24b for the pillar electrode 24, it becomes possible to form the resin 30 having the concave part 31 while suppressing the damage to the electrode part 24a.

As described above, the resin 30 is formed having the concave part 31 so as to expose the desired portion of the pillar electrode 24, and the semiconductor package 1 is obtained. Here, after the formation of the resin 30 having the concave part 31 in this manner, plating processing of solder or the like may be performed on the lead terminal 12 exposed from the resin 30.

In the above described semiconductor package 1, the resin 30 covers the wire 50 which is connected from the electrode pad 23 of the semiconductor chip 20 to the lead terminal 12 at a certain height, the concave part 31 is provided in the resin 30, and the upper surface or the upper end part of the pillar electrode 24 is exposed from the resin 30 at the bottom face 31a thereof. Thereby, compared with the case of providing a pillar electrode at such a height as to be exposed from the resin 30 without providing the concave part 31 in the resin 30, it becomes possible to provide the pillar electrode 24 having a low height.

The pillar electrodes 24 may be formed on the wiring layer 22 of the semiconductor chip 20 as described above by the use of the plating method. By reducing the height of the pillar electrodes 24 to be formed, it becomes possible to realize time saving in the plating of the pillar electrodes 24 and cost (manufacturing cost and material cost) saving in the forming of the semiconductor chip 20 provided with the pillar electrodes 24. Further, it becomes possible to realize cost saving in the formation of the semiconductor package 1 provided with the semiconductor chip 20 as described above. Further, since the resist 26 used as a mask may be made thinner in the formation of the pillar electrodes 24, it becomes possible to form a fine pattern in the resist 26 and it becomes possible to provide the pillar electrodes 24 having a fine pattern and to provide the pillar electrodes 24 having a narrow pitch.

Further another semiconductor chip may be mounted on the semiconductor package 1 by the use of the pillar electrodes 24 exposed from the concave part 31 of the resin 30.

Figure 14:
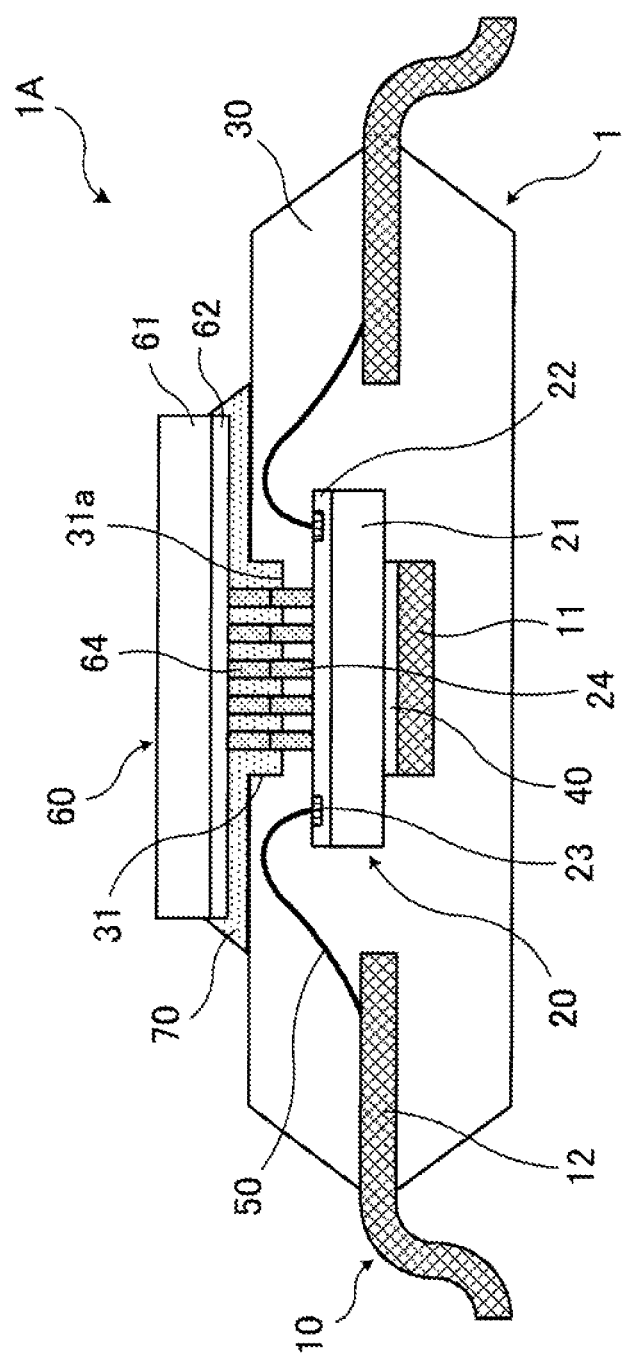
FIG. 14 illustrates an example of a semiconductor device according to the first embodiment.

FIG. 14 illustrates an example of a semiconductor device according to the first embodiment. Here, FIG. 14 is a schematic cross-sectional view of the example of the semiconductor device according to the first embodiment.

A semiconductor device 1A illustrated in FIG. 14 has a semiconductor package 1 including the semiconductor chip 20 and a semiconductor chip 60 (semiconductor element) mounted on the semiconductor package 1. Here, as an example, there will be described a case of mounting the semiconductor chip 60 having a larger planar size than the semiconductor chip 20 included in the semiconductor package 1.

The semiconductor chip 60 has a semiconductor substrate 61 in which an element such as a transistor is formed and a wiring layer 62 which is formed on the semiconductor substrate 61 and includes conductor parts (wiring and via) connected electrically to the element such as a transistor. On the surface of the wiring layer 62, plural pillar electrodes 64 are provided connected electrically to the conductor parts inside the wiring layer 62. The pillar electrodes 64 are provided at positions corresponding to the pillar electrodes 24 of the semiconductor chip 20 included in the semiconductor package 1. The pillar electrode 64 may have the same structure as the pillar electrode 24 of the semiconductor chip 20. That is, the pillar electrode 64 may have a structure having an electrode part made of Cu or the like or a structure having the electrode part and a solder part or the like provided thereon.

The semiconductor chip 60 is disposed with the mounting face of the pillar electrodes 64 facing toward the concave part 31 in the resin 30, the pillar electrodes 64 are bonded to the pillar electrodes 24 in the concave part 31, and the semiconductor chip 60 is electrically connected (flip-chip connected) to the semiconductor chip 20. Under-fill material 70 (insulating layer) is filled between the semiconductor package 1 and the semiconductor chip 60. Resin material such as epoxy resin may be used for the under-fill material 70.

In the semiconductor device 1A, for example, the semiconductor chip 20 provided within the semiconductor package 1 may be a logic chip incorporating a logic circuit, and the semiconductor chip 60 mounted on the semiconductor package 1 may be a memory chip storing information. In the semiconductor device 1A as described above, since the logic chip and the memory chip are connected in a short distance, it becomes possible to realize a higher speed operation than in a mode in which each of the semiconductor package incorporating the logic chip and the memory chip is provided on a circuit substrate, for example. Moreover, compared with such a mode, it becomes possible to realize downsizing of a mounting area on the circuit substrate or downsizing of the circuit substrate to be used. Further, in the semiconductor device 1A, compared with a device such as SoC (System on a Chip) mounting a logic part and a memory part in a mixed state, it is possible to conveniently realize a device including the same function, and to flexibly deal with a change in the memory chip or the like.

The semiconductor device 1A as described above may be formed by the following method, for example.

Figure 15:
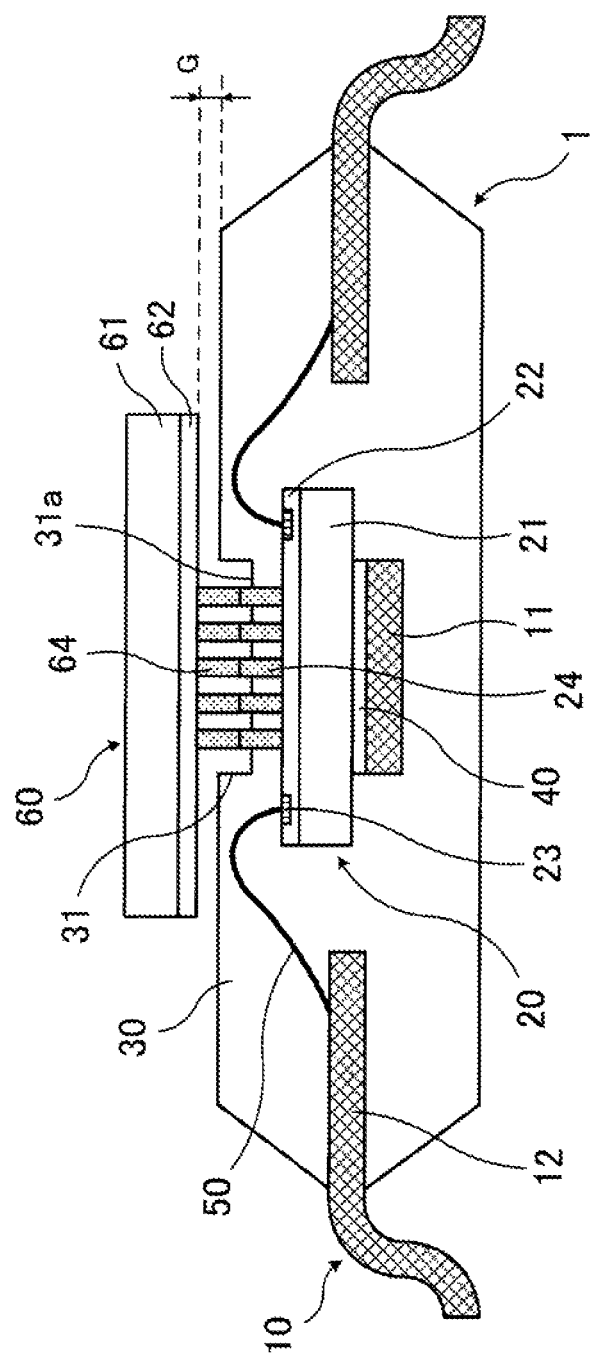
FIG. 15 is a diagram (part 1) illustrating an example of a semiconductor device formation method according to the first embodiment.
Figure 16:
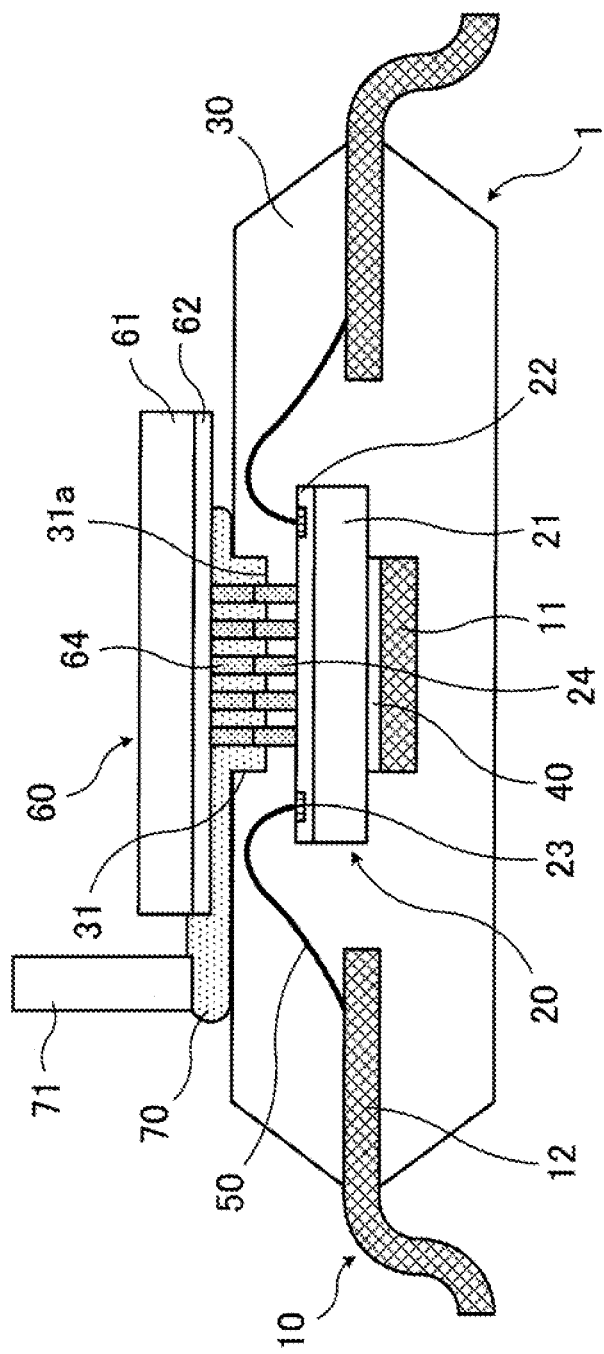
FIG. 16 is a diagram (part 2) illustrating an example of a semiconductor device formation method according to a first embodiment.

FIG. 15 and FIG. 16 illustrate an example of a formation method for the semiconductor device according to the first embodiment.

First, as illustrated in FIG. 15, the semiconductor chip 60 is disposed on the mounting face side of the concave part 31 in the semiconductor package 1 with the pillar electrodes 64 facing toward the concave part 31, and the pillar electrodes 64 are bonded to the pillar electrodes 24 in the concave part 31.

When the pillar electrode 24 has the electrode part (24a) of Cu or the like and the solder part (24b) thereon and similarly the pillar electrode 64 also has the electrode part of Cu or the like and the solder part thereon, for example, the electrode part of the pillar electrode 24 and the electrode part of the pillar electrode 64 are bonded in both solder parts. When the solder part is provided mainly for either one of the pillar electrode 24 and the pillar electrode 64, the electrode part of the pillar electrode 24 and the electrode part of the pillar electrode 64 are bonded via the solder part. When the solder part is provided for neither the pillar electrode 24 nor the pillar electrode 64, the electrode part of the pillar electrode 24 and the electrode part of the pillar electrode 64 are bonded directly.

When the pillar electrode 24 and the pillar electrode 64 provided with the solder part are bonded, reflow processing is performed using flux. After the reflow processing, flux cleaning is performed.

The pillar electrode 64 is preliminarily formed at a height to secure a desired gap G between the semiconductor chip 60 and the semiconductor package 1 when bonded to the pillar electrode 24.

After the bonding of the pillar electrode 24 and the pillar electrode 64, as illustrated in FIG. 16, the under-fill material 70 is introduced between the semiconductor chip 60 and the semiconductor package 1 by the use of a dispenser 71. After the introduction of the under-fill material 70, curing processing is performed at a desired temperature and in a desired atmosphere.

The pillar electrode 24 and the pillar electrode 64 are formed at appropriate heights and the desired gap G is secured, and thereby it is possible to fill the under-fill material 70 sufficiently between the semiconductor chip 60 and the semiconductor package 1, while suppressing generation of an unfilled region. Further, by forming the pillar electrode 24 and the pillar electrode 64 which are to be bonded in the concave part 31, at appropriate heights in this manner, it is possible to suppress increase in the size (increase in the height) of the semiconductor device 1A when the semiconductor chip 60 is mounted.

The plating processing of solder or the like is performed on the lead terminal 12 exposed from the resin 30 in the semiconductor package 1. Here, as illustrated in FIG. 16, the plating processing of the lead terminal 12 may be performed after the introduction of the under-fill material 70 and the curing processing, and, in addition, may be performed after the formation of the resin 30 which has the concave part 31 as illustrated in above FIGS. 12A, 12B, and 12C, or FIGS. 13A and 13B.

Further, after the formation of the resin 30 having the concave part 31, cutting and bending (trimming and forming step) is performed for the lead terminal 12 exposed from the resin 30 at an appropriate timing (for example, after the formation of the resin 30, the introduction and curing processing of the under-fill material 70, the plating processing, or the like). Here, FIG. 15 and FIG. 16 illustrate a state in which the lead terminal 12 is bent, for convenience.

Here, a semiconductor device of another mode will be described for comparison with the semiconductor device 1A as described above.

Figure 17:
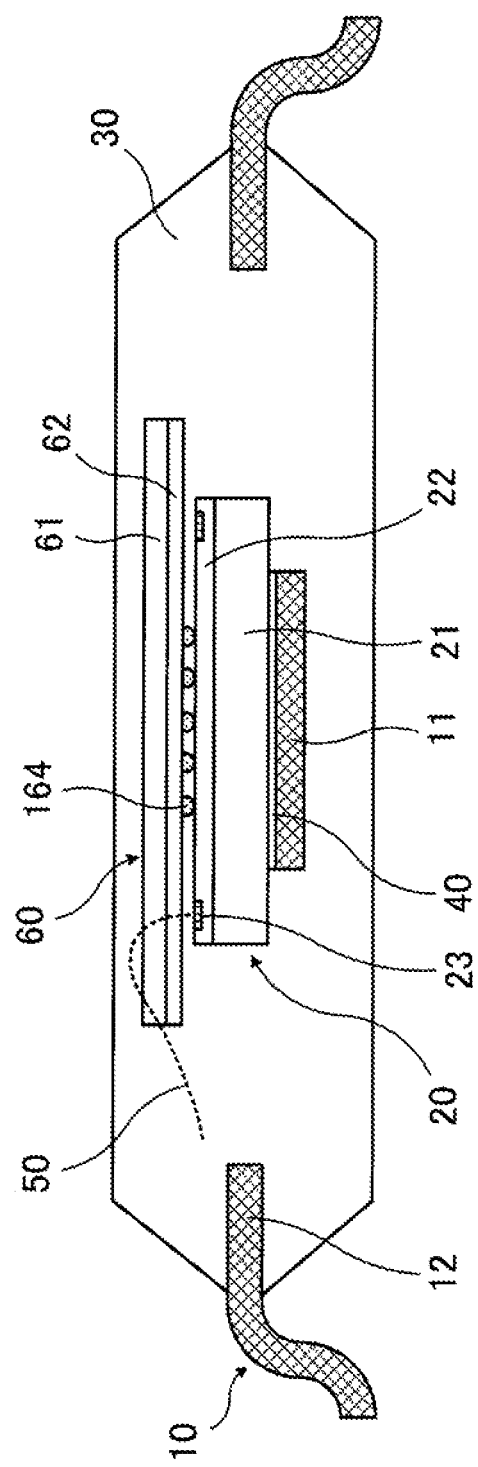
FIG. 17 is a diagram (part 1) for explaining an example of a semiconductor device of another mode.

FIG. 17 is a diagram for explaining an example of the semiconductor device of another mode. Here, FIG. 17 is a schematic cross-sectional view of the example of the semiconductor device of another mode.

First, as illustrated in FIG. 17, there will be considered a case of accommodating both of the semiconductor chip 20 to be wire-bonded to the lead terminal 12 and the semiconductor chip 60 to be flip-chip connected to this semiconductor chip 20 using a bump 164, in the resin 30.

In this case, when the semiconductor chip 20 is mounted on the lead frame 10 and then the semiconductor chip 60 having a larger planar size is flip-chip connected thereon, the electrode pad 23 is covered by the semiconductor chip 60 and the wire 50 (illustrated by a dotted line in FIG. 17) is unable to be connected thereto.

While there is a method of connecting the wire 50 in advance after the semiconductor chip 20 is mounted on the lead frame 10 and then flip-chip connects the semiconductor chip 60, in this method, there might be caused a case in which the semiconductor chip 60 is unable to be mounted on the semiconductor chip 20. For example, when the bumps 164 of the semiconductor chip 60 have a narrow pitch and small sizes, even when loop height of the wire 50 is reduced, the semiconductor chip 60 interfere with the wire 50 and sometimes the bump 164 is unable to be connected to the semiconductor chip 20.

Figure 18:
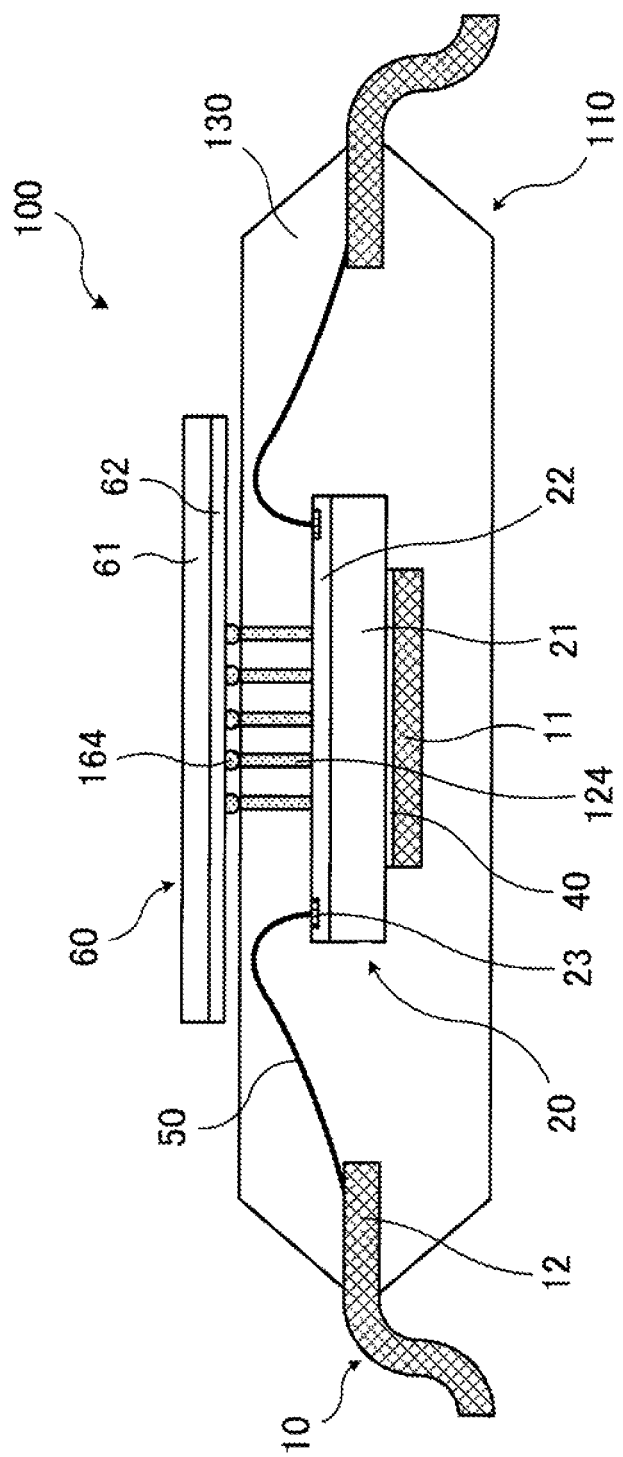
FIG. 18 is a diagram (part 2) for explaining an example of a semiconductor device of another mode.
Figure 19:
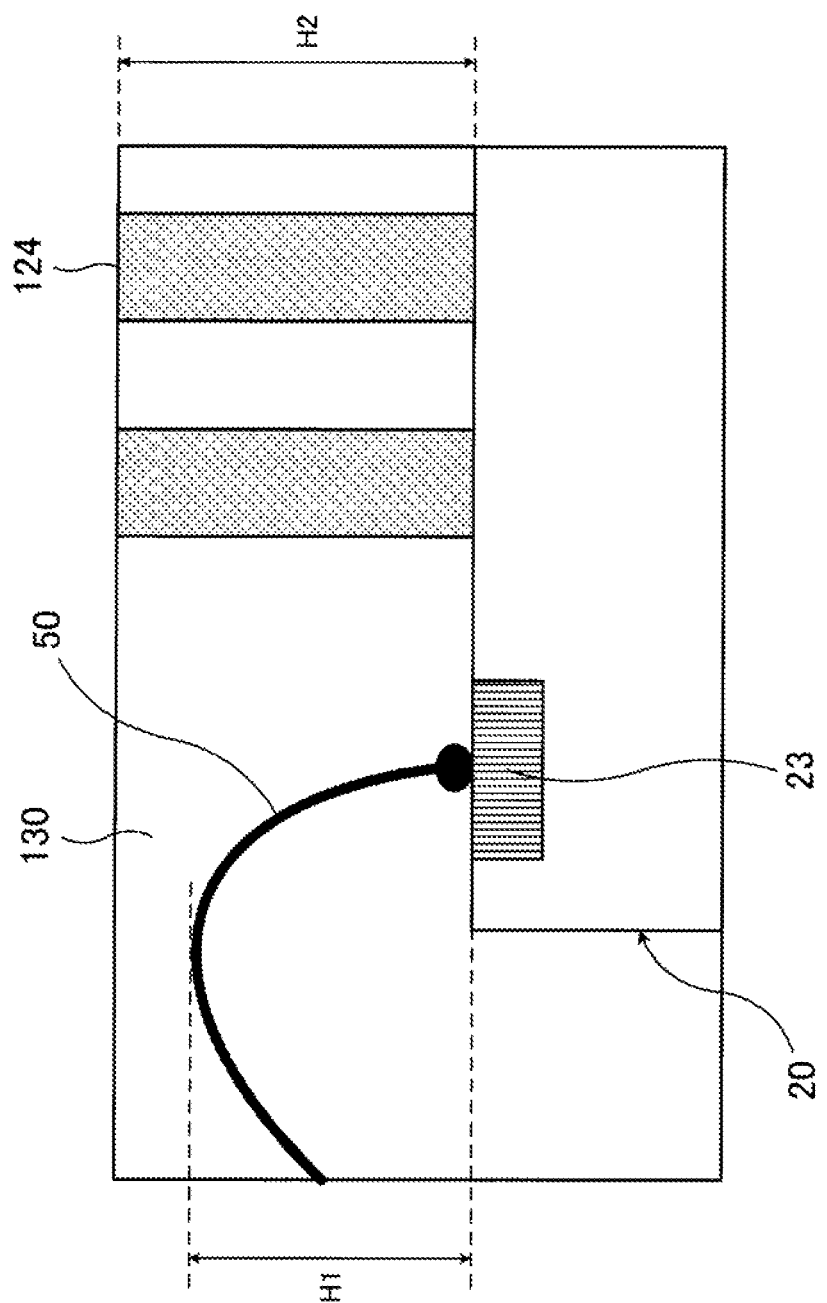
FIG. 19 is a diagram (part 3) for explaining an example of a semiconductor device of another mode.
Figure 20:
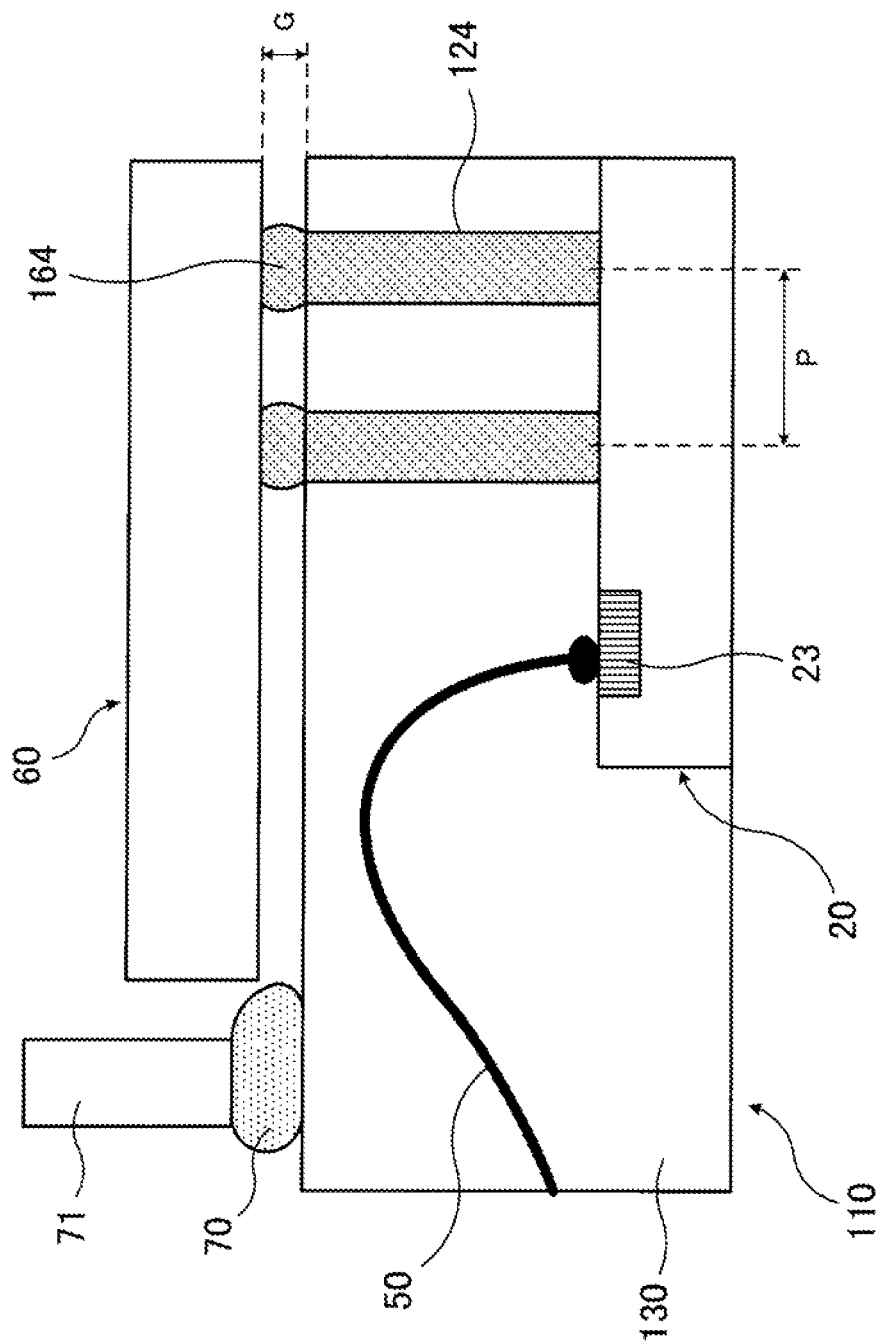
FIG. 20 is a diagram (part 4) for explaining an example of a semiconductor device of another mode.

FIG. 18 to FIG. 20 are diagram for explaining an example of a semiconductor device of still another mode. Here, FIG. 18 is a schematic cross-sectional view of the example of the semiconductor device of the still another mode, and FIG. 19 and FIG. 20 are schematic partial cross-sectional views of the example of the semiconductor device of the still another mode.

A semiconductor device 100 illustrated in FIG. 18 includes a semiconductor package 110 and the semiconductor chip 60 mounted thereon.

The semiconductor package 110 has a structure in which resin 130 covers the lead frame 10 except a part of the lead terminal 12, the semiconductor chip 20 mounted on the lead frame 10, and the wire 50 connecting the lead frame 10 and the semiconductor chip 20. In this semiconductor package 110, the concave part 31 is not provided in the resin 130 as in the above semiconductor package 1. The semiconductor chip 20 is provided with a pillar electrode 124 which has such a comparatively large height as to be exposed from the surface of the resin 130 as described above.

The semiconductor package 110 is formed by the following procedure, for example. First, each of the lead frame 10 and the semiconductor chip 20 provided with the pillar electrode 124 is prepared. Successively, the semiconductor chip 20 is mounted on the die bonding stage 11 of the lead frame 10 by the use of the die bonding material 40, and the electrode pad 23 and the lead terminal 12 are connected by the wire 50. Then, the resin 130 is formed so as to expose the upper surface of the pillar electrode 124. The resin 130 may be formed by the mold forming. The laser processing may be performed on the resin 130 after the forming and the upper surface of the pillar electrode 124 may be exposed.

The semiconductor chip 60 having a larger planar size than the semiconductor chip 20 is flip-chip connected onto the semiconductor package 110 as described above, with the bump 164 and the pillar electrode 124 being bonded with each other.

Since the semiconductor chip 60 is mounted on the semiconductor package 110 in the semiconductor device 100 as described above, it becomes possible to avoid the problem that the wire 50 is unable to be connected or the semiconductor chip 60 is unable to be mounted as described in above FIG. 17.

In this semiconductor device 100, however, since the resin 130 having a thickness large enough to cover the wire 50 is provided above the semiconductor chip 20, it is needed to form the pillar electrode 124 having a height large enough to pass through the resin 130 having this large thickness, on the semiconductor chip 20. For example, when a height H1 of the wire 50 illustrated in FIG. 19 is 100 μm to 130 μm, the resin 130 on the semiconductor chip 20 has a height H2 of 100 μm to 150 μm for covering the wire 50. Accordingly, the pillar electrode 124 having a height of 100 μm to 150 μm large enough to pass through the resin 130 thereon is formed on the semiconductor chip 20. When the pillar electrode 124 having such a height is formed by the plating method, a comparatively long time is consumed for the formation thereof. Further, when the pillar electrode 124 having such a height is formed by the plating method, resist to be used as a mask becomes also thick and it is difficult to form a fine pattern in the resist, and therefore it becomes difficult to form the pillar electrodes 124 having fine patterns or a narrow pitch.

Further, in the semiconductor device 100, sometimes the under-fill material 70 is unable to be filled sufficiently between the semiconductor package 110 and the semiconductor chip 60 by the use of the dispenser 71. For example, when the pitch P of the pillar electrodes 124 illustrated in FIG. 20 comes to have a value such as a value not larger than 100 μm, the size of the bump 164 on the semiconductor chip 60 becomes small and also the gap G between the semiconductor chip 60 and the semiconductor package 110 becomes small. When the gap G becomes small as described above, it becomes difficult to introduce the under-fill material 70 inside from the side of the semiconductor chip 60 and the under-fill material 70 is not filled sufficiently, and thereby there is a possibility of inviting degradation of connection strength between the semiconductor chip 60 and the semiconductor package 110.

On the other hand, in the semiconductor device 1A illustrated in above FIG. 14, while the wire 50 connected to the semiconductor chip 20 is covered by the resin 30, the semiconductor package 1 is provided with the concave part 31 in the disposition region of the pillar electrode 24, and the pillar electrode 24 is exposed from the resin 30 at the bottom face 31a thereof. Then, the pillar electrode 64 of the semiconductor chip 60 is bonded to the pillar electrode 24 on the semiconductor package 1 side and the under-fill material 70 is filled between the semiconductor chip 60 and the semiconductor package 1.

By providing the concave part 31 in the resin 30, it is possible to provide the pillar electrode 24 having a smaller height and it is possible to cover the wire 50 with the resin 30 without providing a pillar electrode having a large height. Since it is possible to provide the pillar electrode 24 having a small height, it becomes possible to form the pillar electrodes 24 having fine patterns or a narrow pitch efficiently at a low cost.

Further, the semiconductor device 1A has the bonded part between the pillar electrode 64 of the semiconductor chip 60 and the pillar electrode 24 of the semiconductor package 1 within the concave part 31. While the height of the semiconductor device 1A can be reduced, it is possible to secure the desired gap G between the semiconductor chip 60 and the semiconductor package 1 and it becomes possible to fill the under-fill material 70 sufficiently.

Next, a second embodiment will be explained.

In the resin 30 of the semiconductor package 1 used in the semiconductor device 1A, in addition to the above concave part 31, a groove communicated with the concave part 31 may be provided.

Figure 21:
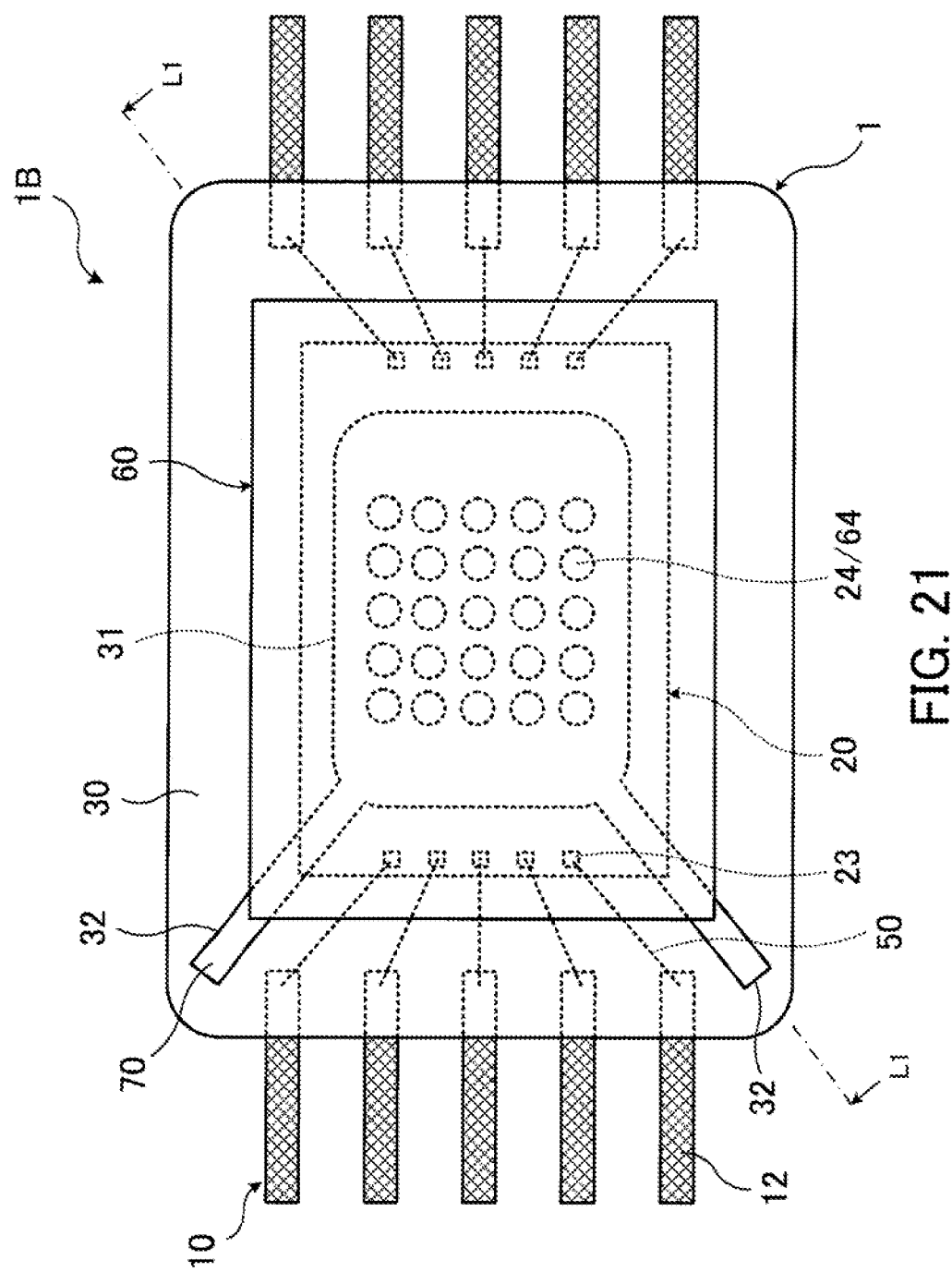
FIG. 21 is a diagram (part 1) illustrating an example of a semiconductor device according to a second embodiment.
Figure 22:
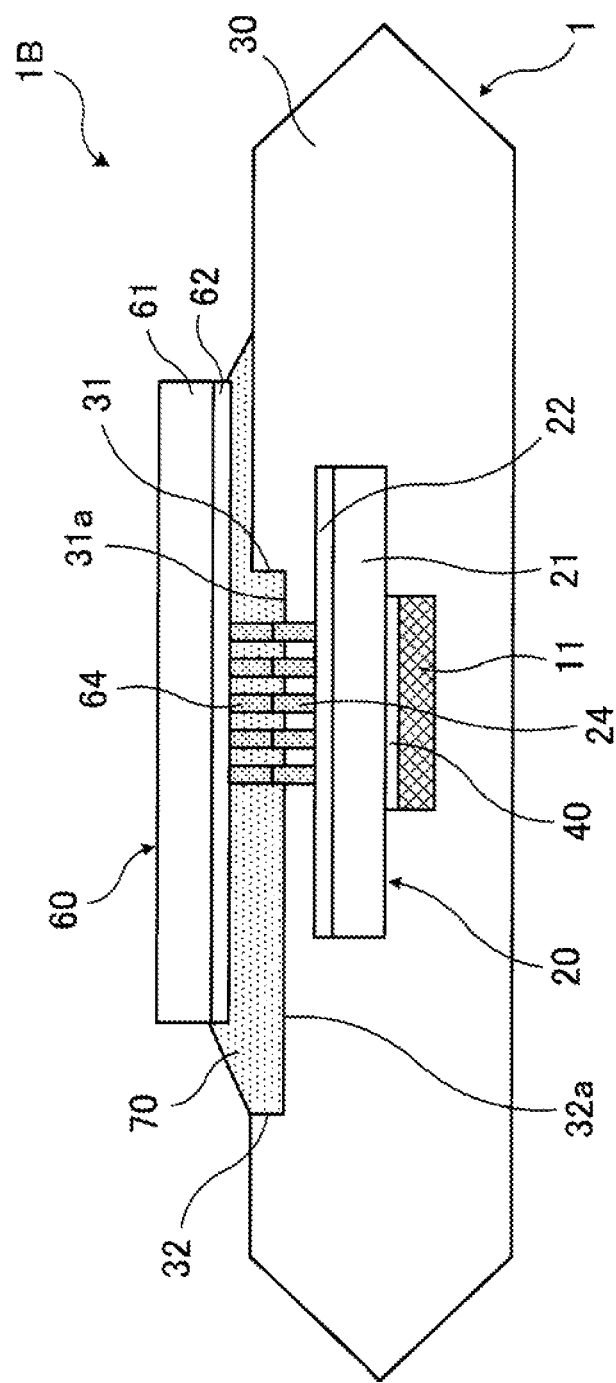
FIG. 22 is a diagram (part 2) illustrating an example of a semiconductor device according to the second embodiment.

FIG. 21 and FIG. 22 illustrate an example of a semiconductor device according to the second embodiment. Here, FIG. 21 is a schematic plan view of the example of the semiconductor device according to the second embodiment, and FIG. 22 is a schematic cross-sectional view along L1-L1 of FIG. 21.

A semiconductor device 1B illustrated in FIG. 21 and FIG. 22 is different from the semiconductor device 1A according to the first embodiment in the point that, in addition to the concave part 31, grooves 32 (here, two grooves 32, as an example) communicated with the concave part 31 are provided in the resin 30 of the semiconductor package 1.

The groove 32 is provided so as to extend from the concave part 31 to the outside of the semiconductor chip 60 to be mounted on the semiconductor package 1. Here, the grooves 32 are illustrated extending from the concave part 31 toward two corners among the four corners of the semiconductor chip 60. The groove 32 has the same depth as the concave part 31, for example, and is provided in the resin 30 so as to avoid the wire 50 which connects the semiconductor chip 20 and the lead frame 10 in the semiconductor package 1. In this case, the groove 32 may be provided such that the bottom face 32a thereof is deeper than the upper end of the wire 50.

The groove 32 may be formed in the resin 30 together with the concave part 31 which is formed by the method as illustrated in above FIGS. 12A, 12B, and 12C or FIGS. 13A and 13B. That is, according to the example of FIGS. 12A, 12B, and 12C, a part where the concave part 31 is to be formed and a part where the groove 32 is to be formed in the resin 30 after the mold forming are irradiated with the laser 300, and the concave part 31 and the groove 32 are formed. Alternatively, according to the example of FIGS. 13A and 13B, mold forming is performed using a metal mold 200 which is provided with the convex part 211 corresponding to the concave part 31 to be formed and a convex part corresponding to the groove 32 to be formed, and the concave part 31 and the groove 32 are formed.

The groove 32 may be used as an introduction port when the under-fill material 70 is introduced between the semiconductor package 1 and the semiconductor chip 60 after the semiconductor chip 60 is mounted on the semiconductor package 1, that is, after the pillar electrode 24 and the pillar electrode 64 are bonded. When the under-fill material 70 is introduced, the under-fill material 70 is introduced to the groove 32 and the concave part 31 from a part of the groove 32 protruding to outside of the semiconductor chip 60 by the use of the dispenser 71.

The introduction of the under-fill material 70 may be performed at the same time or sequentially from the two grooves 32. By introducing the under-fill material 70 in the two directions, it becomes possible to adjust flow of the under-fill material 70 between the semiconductor package 1 and the semiconductor chip 60 and to suppress the generation of the unfilled region, for example. Further, the introduction of the under-fill material 70 is performed from one of the grooves 32 and it is determined whether the under-fill material 70 flows out or not from the other groove 32, and thereby the other groove 32 may be used for confirming whether the under-fill material 70 is filled or not between the semiconductor package 1 and the semiconductor chip 60.

By introducing the under-fill material 70 from the grooves 32 in this manner, it is possible to fill the under-fill material 70 between the semiconductor package 1 and the semiconductor chip 60 sufficiently while suppressing the generation of the unfilled region.

The under-fill material 70 is filled in the groove 32 under the semiconductor chip 60 in addition to the concave part 31. Therefore, the semiconductor chip 60 and the semiconductor package 1 are bonded firmly and it becomes possible to realize the semiconductor device 1B which has an excellent reliability in the connection between the semiconductor package 1 and the semiconductor chip 60.

Further, since the introduction of the under-fill material 70 into the concave part 31 may be performed by the use of the groove 32, it is also possible to reduce the gap G between the semiconductor package 1 and the semiconductor chip 60. Thereby, it becomes also possible to reduce the heights of the pillar electrode 24 and the pillar electrode 64, and to realize a higher efficiency and a lower cost in the formation of the semiconductor package 1 and the semiconductor chip 60.

Note that, it is not always needed that the groove 32 provided in the resin 30 has the same depth as the concave part 31.

Figure 23:
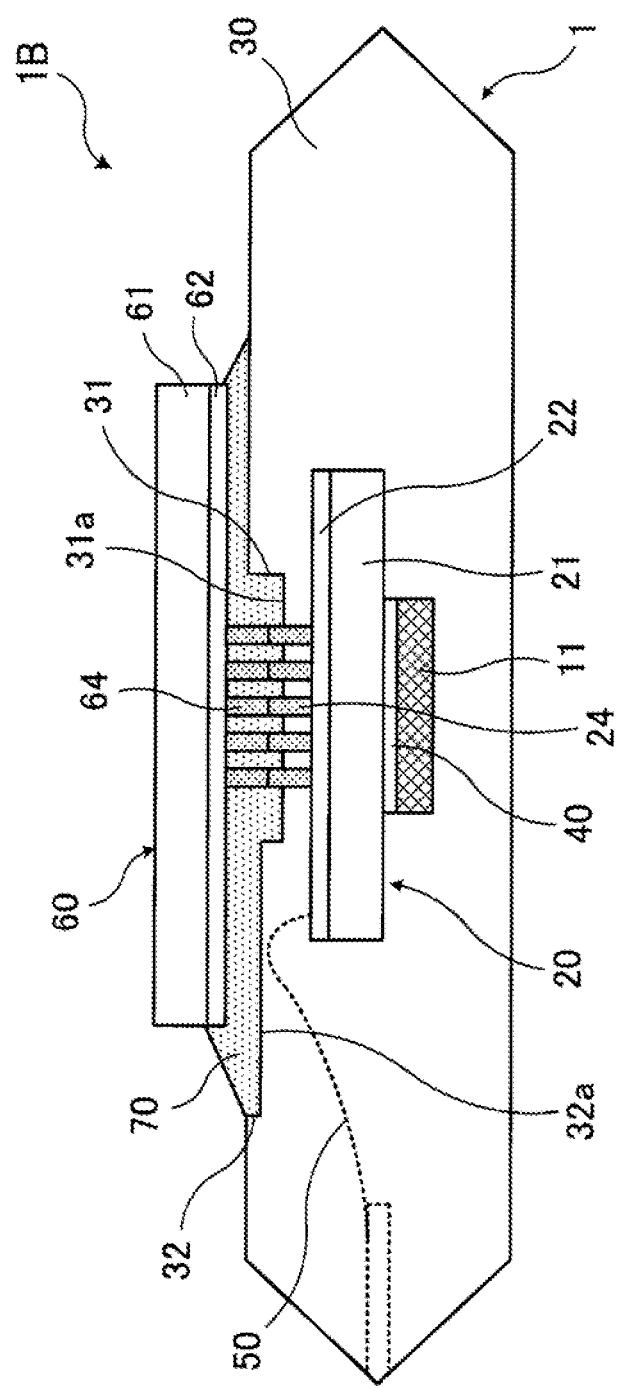
FIG. 23 illustrates a first modification of a semiconductor device according to the second embodiment.

FIG. 23 illustrates a first modification of the semiconductor device according to the second embodiment. Here, FIG. 23 is a schematic cross-sectional view of the modification of the semiconductor device according to the second embodiment and a schematic cross-sectional view corresponding to the position of L1-L1 line in FIG. 21.

The groove 32 having a shallower depth than the concave part 31 may be provided in the resin 30 of the semiconductor package 1 provided in the semiconductor device 1B, as illustrated in FIG. 23. In this case, for example, the groove 32 may be provided such that the bottom face 32a thereof is shallower than the upper end of the wire 50 (illustrated by a dotted line in FIG. 23, for convenience). Here, when the groove 32 is provided such that the bottom face 32a is shallower than the upper end of the wire 50, even when the groove 32 is provided regardless of the position of the wire 50, the wire 50 is not exposed from the resin 30 and the wire 50 is included in the resin 30.

The groove 32 may be formed in the resin 30 by the irradiation of the laser 300 onto each of the regions where the concave part 31 and the groove 32 are formed or by the mold forming using a metal mold 200 having a convex part corresponding to each of the concave part 31 and the groove 32, according to the example of FIGS. 12A, 12B, and 12C or FIGS. 13A and 13B, as similar to the above.

In the semiconductor device 1B as illustrated in FIG. 23, the concave part 31 with a certain depth provided in the resin 30 can reduce the height of the pillar electrode 24 and also the wire 50 is included within the resin 30, and the under-fill material 70 is introduced from the groove 32 shallower than the concave part 31. Also when the groove 32 shallower than the concave part 31 is provided, it is possible to fill the under-fill material 70 sufficiently between the semiconductor package 1 and the semiconductor chip 60 from the groove 32, and to realize the semiconductor device 1B having an excellent reliability in the connection between the semiconductor package 1 and the semiconductor chip 60.

Further, the number of the grooves 32 provided in the resin 30 is not limited to two as described above.

Figure 24A:
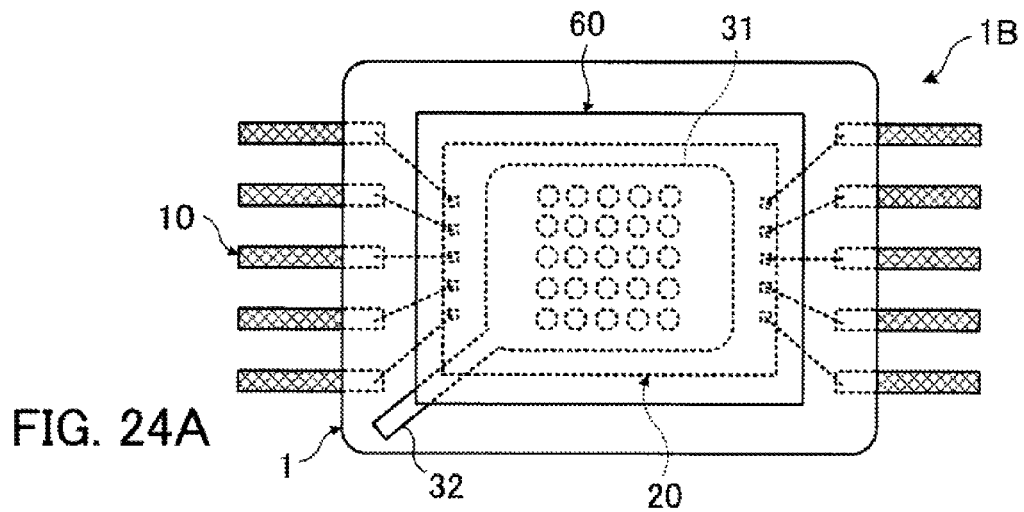
FIGS. 24A, 24B, and 24C illustrate second modifications of a semiconductor device according to the second embodiment.
Figure 24B:
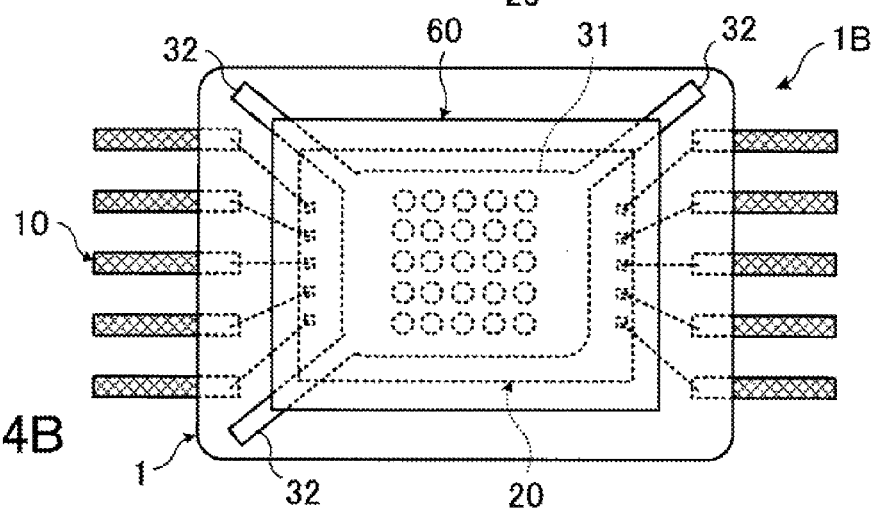
Figure 24C:
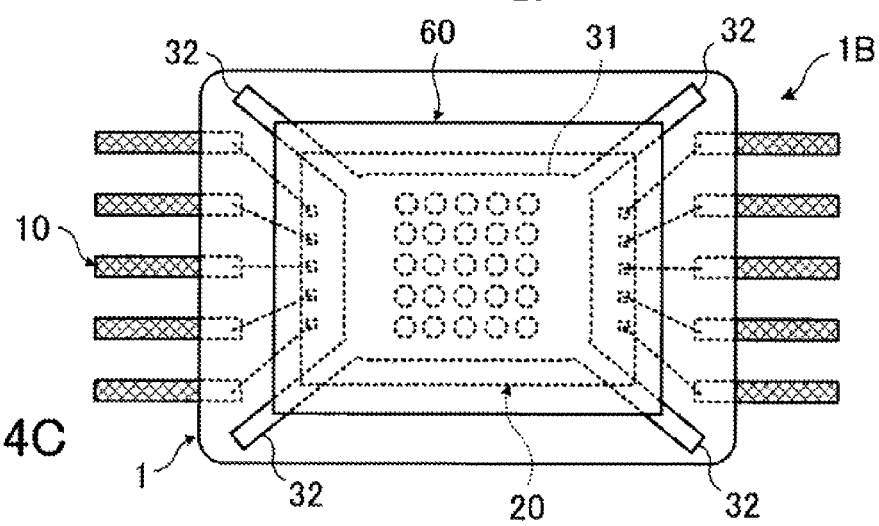

FIGS. 24A, 24B, and 24C illustrate second modifications of the semiconductor device according to the second embodiment. Here, FIGS. 24A, 24B, and 24C are schematic plan views of the respective modifications of the semiconductor device according to the second embodiment.

As illustrated in FIG. 24A, the resin 30 may be also provided with the groove 32 which extends from the concave part 31 toward one corner of the semiconductor chip 60 to the outside of the semiconductor chip 60. The under-fill material 70 is introduced from this one groove 32.

Further, as illustrated in FIG. 24B, the resin 30 may be also provided with the three grooves 32 which extend from the concave part 31 toward three corners of the semiconductor chip 60 to the outside of the semiconductor chip 60. As illustrated in FIG. 24C, the resin 30 may be also provided with the four grooves 32 which extend from the concave part 31 toward the four corners of the semiconductor chip 60 to the outside of the semiconductor chip 60. By providing the three or four grooves 32, it is possible to introduce the under-fill material 70 in plural directions, to suppress the generation of the unfilled region by adjusting the flow thereof, and to use some of the grooves 32 for confirming whether the under-fill material 70 is filled or not.

Next, a third embodiment will be explained.

Figure 25:
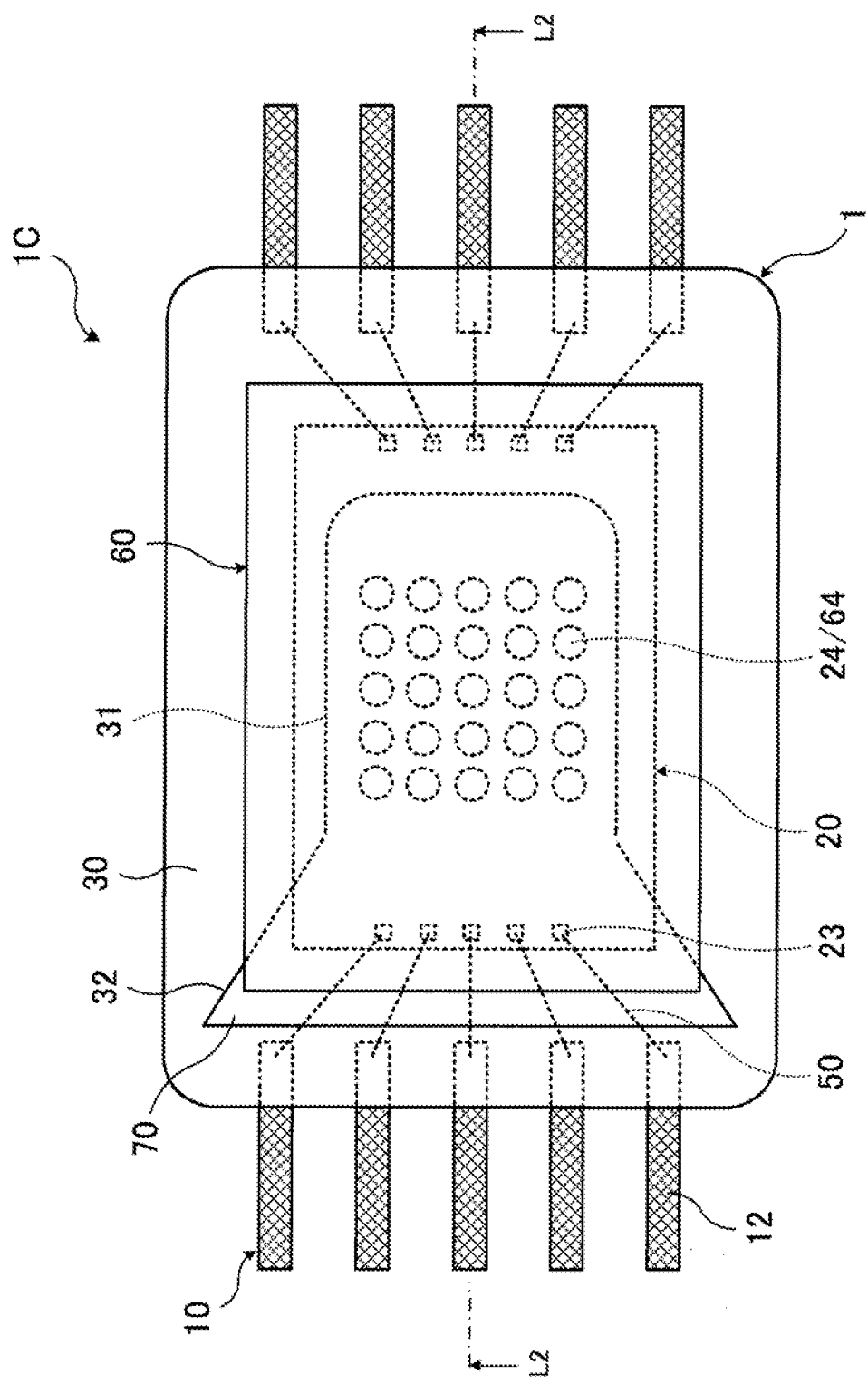
FIG. 25 is a diagram (part 1) illustrating an example of a semiconductor device according to a third embodiment.
Figure 26:
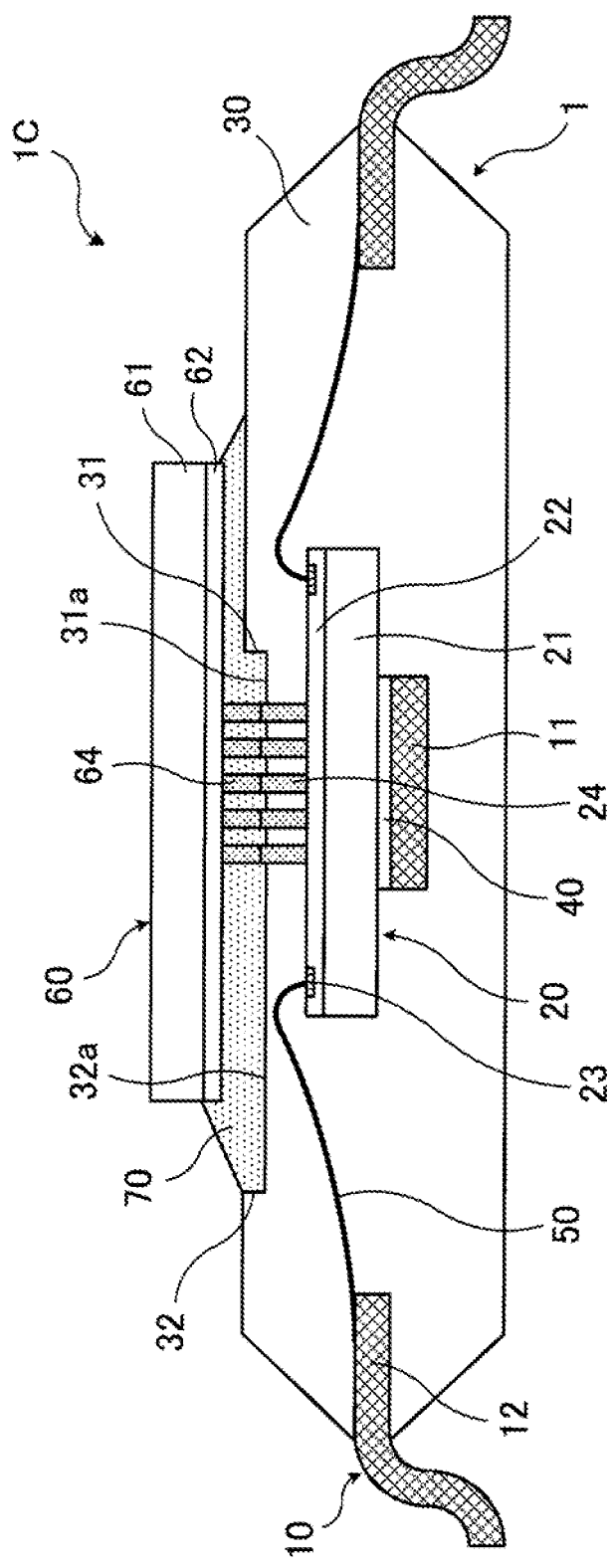
FIG. 26 is a diagram (part 2) illustrating an example of a semiconductor device according to the third embodiment.

FIG. 25 and FIG. 26 illustrate an example of a semiconductor device according to the third embodiment. Here, FIG. 25 is a schematic plan view of the example of the semiconductor device according to the third embodiment, and FIG. 26 is a schematic cross-sectional view along L2-L2 of FIG. 25.

A semiconductor device 1C illustrated in FIG. 25 and FIG. 26 is different from the semiconductor device 1B according to the above second embodiment in the point that the groove 32 communicated with the concave part 31 is provided so as to extend from the concave part 31 toward a side of the semiconductor chip 60 (here, one of the four sides, as an example) to the outside thereof.

In the case of the semiconductor device 1C, the groove 32 has the same depth as the concave part 31 and is provided such that the bottom face 32a thereof is shallower than the upper end of the wire 50, for example. By the provision of the groove 32 at such a depth, the wire 50 is included in the resin 30. The groove 32 may be formed together with the concave part 31 in the resin 30 by the irradiation of the laser 300 or by the mold forming using a metal mold 200 which has a convex part corresponding to the groove 32, as described in the above second embodiment.

The under-fill material 70 is introduced from a part of the groove 32 protruding to outside of the side of the semiconductor chip 60, between the semiconductor package 1 and the semiconductor chip 60 by the use of the dispenser 71 after the mounting (after the bonding of the pillar electrode 24 and the pillar electrode 64). In the semiconductor device 1C, since the groove 32 is provided corresponding to the side of the semiconductor chip 60 to be mounted, in the resin 30 of the semiconductor package 1, it is possible to introduce the under-fill material 70 in a large amount at one time. Accordingly, it is possible to fill the under-fill material 70 efficiently between the semiconductor package 1 and the semiconductor chip 60.

The under-fill material 70 is filled into the concave part 31 and the groove 32 corresponding to the side of the semiconductor chip 60. Therefore, it becomes possible to bond the semiconductor chip 60 and the semiconductor package 1 firmly and to realize the semiconductor device 1C which has an excellent reliability in the connection between the semiconductor chip 60 and the semiconductor package 1.

Further, since the under-fill material 70 is introduced into the concave part 31 by the use of the groove 32, it becomes also possible to narrow the gap G between the semiconductor package 1 and the semiconductor chip 60.

Note that, it is not always needed that the groove 32 provided in the resin 30 has the same depth as the concave part 31.

Figure 27:
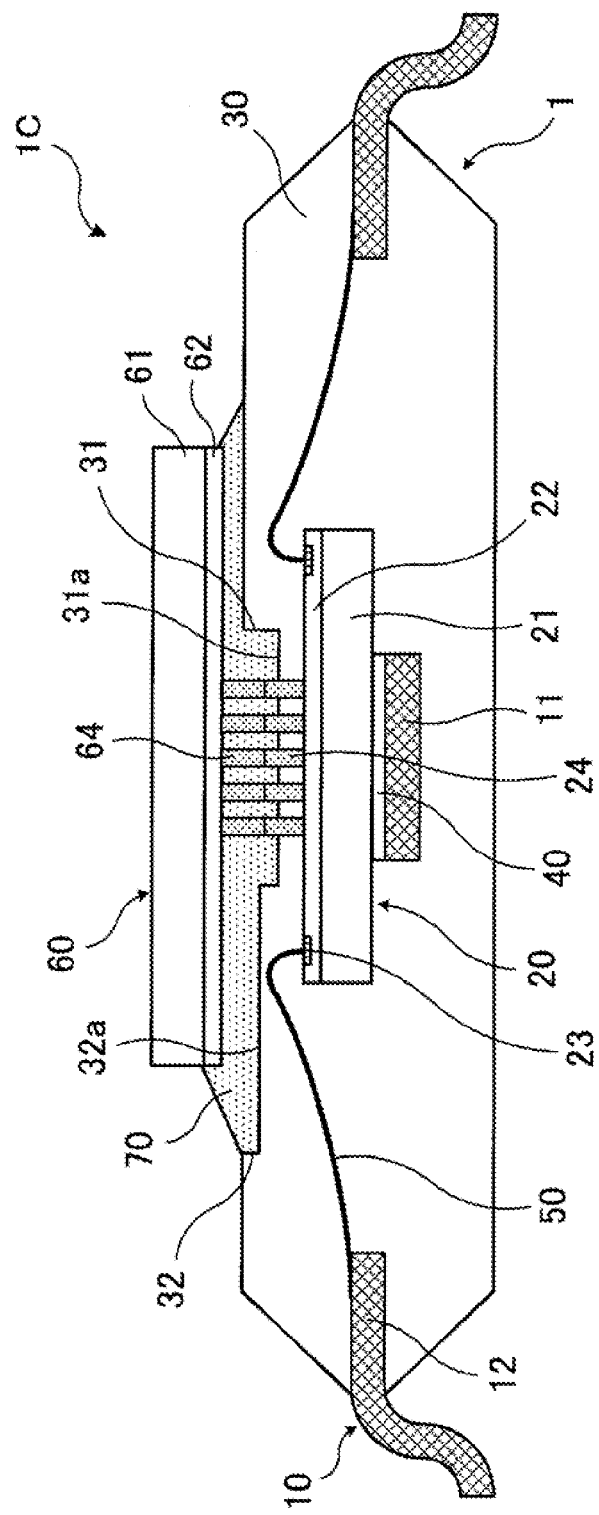
FIG. 27 illustrates a first modification of a semiconductor device according to the third embodiment.

FIG. 27 illustrates a first modification of the semiconductor device according to the third embodiment. Here, FIG. 27 is a schematic cross-sectional view of the modification of the semiconductor device according to the third embodiment, and a schematic cross-sectional view corresponding to the position of L2-L2 line in FIG. 25.

As illustrated in FIG. 27, the groove 32 provided corresponding to the side of the semiconductor chip 60 may be shallower than the concave part 31 and may also be provided such that the bottom face 32a of the groove 32 is shallower than the upper end of the wire 50. By providing the groove 32 at this depth, it is possible to include the wire 50 within the resin 30 while making the depth of the concave part 31 larger.

The groove 32 may be formed in the resin 30 by the irradiation of the laser 300 to each of the regions where the concave part 31 and the groove 32 are formed or by the mold forming using a metal mold 200 which has a convex part corresponding to each of the concave part 31 and the groove 32, according to the example of FIGS. 12A, 12B, and 12C, or FIGS. 13A and 13B, as similar to the above.

In the semiconductor device 1C as illustrated in FIG. 27, since the concave part 31 is formed deeper than the groove 32, it is possible to reduce the height of the pillar electrode 24.

In the semiconductor device 1C, the concave part 31 with a certain depth provided in the resin 30 can reduce the height of the pillar electrode 24 and also the wire 50 is included within the resin 30, and the under-fill material 70 is introduced from the wide groove 32 shallower than the concave part 31. Also when the groove 32 shallower than the concave part 31 is provided, it is possible to fill the under-fill material 70 sufficiently and efficiently from the wide groove 32 between the semiconductor package 1 and the semiconductor chip 60 and to realize the semiconductor device 1C having an excellent reliability in the connection.

Note that, it is not always needed that the groove 32 provided in the resin 30 is disposed such that the bottom face 32a thereof is shallower than the upper end of the wire 50.

Figure 28:
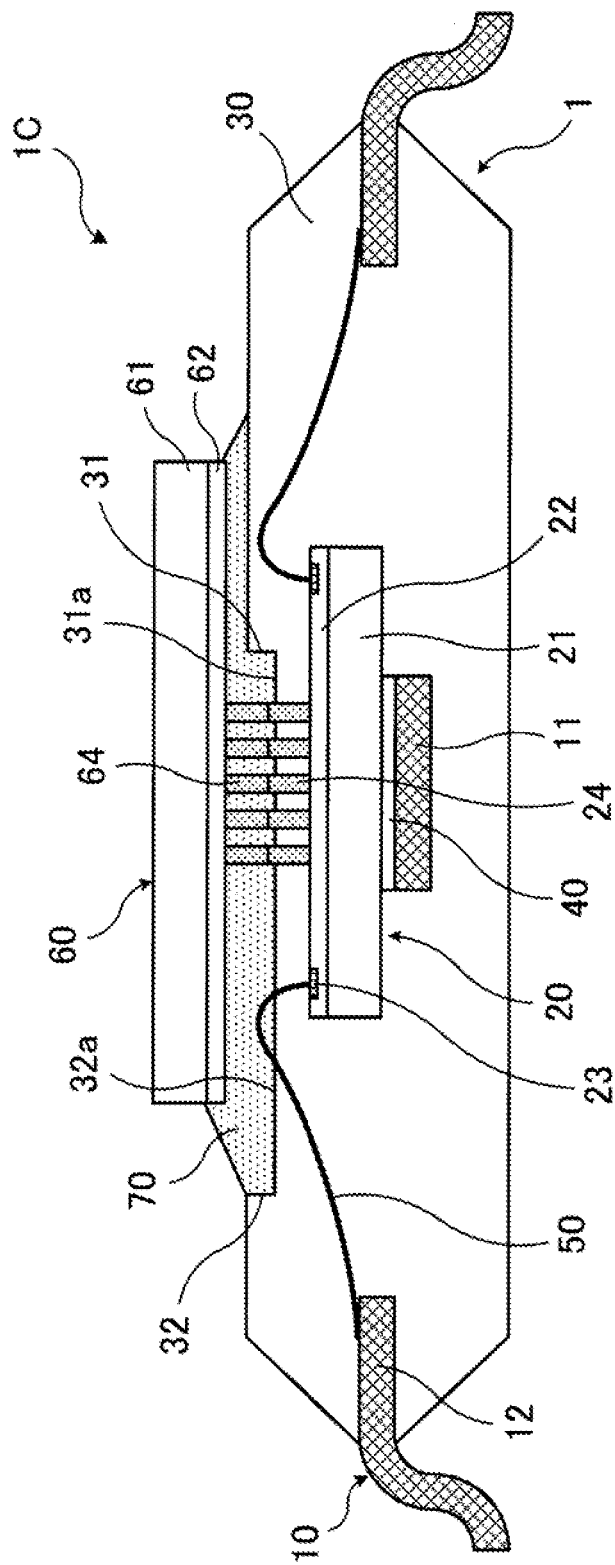
FIG. 28 illustrates a second modification of a semiconductor device according to the third embodiment.

FIG. 28 illustrates a second modification of the semiconductor device according to the third embodiment. Here, FIG. 28 is a schematic cross-sectional view of the modification of the semiconductor device according to the third embodiment.

As illustrated in FIG. 28, the groove 32 provided corresponding to the side of the semiconductor chip 60 may be also formed such that the bottom face 32a thereof is deeper than the upper end of the wire 50. In this case, a part of the wire 50 is exposed from the resin 30 in the groove 32. The groove 32 having such a depth may be formed by the use of a method of irradiating the laser 300 as illustrated in FIGS. 12A, 12B, and 12C.

The under-fill material 70 is introduced from the groove 32 as described above into the concave part 31 after the mounting of the semiconductor chip 60 on the semiconductor package 1 (after the pillar electrodes 24 and the pillar electrodes 64 are bonded). At this time, since the part of the wire 50 exposed from the resin 30 in the groove 32 is covered by the under-fill material 70, there does not arise an electrical problem caused by the exposure of the wire 50 from the resin 30.

Next, a fourth embodiment will be explained.

Figure 29:
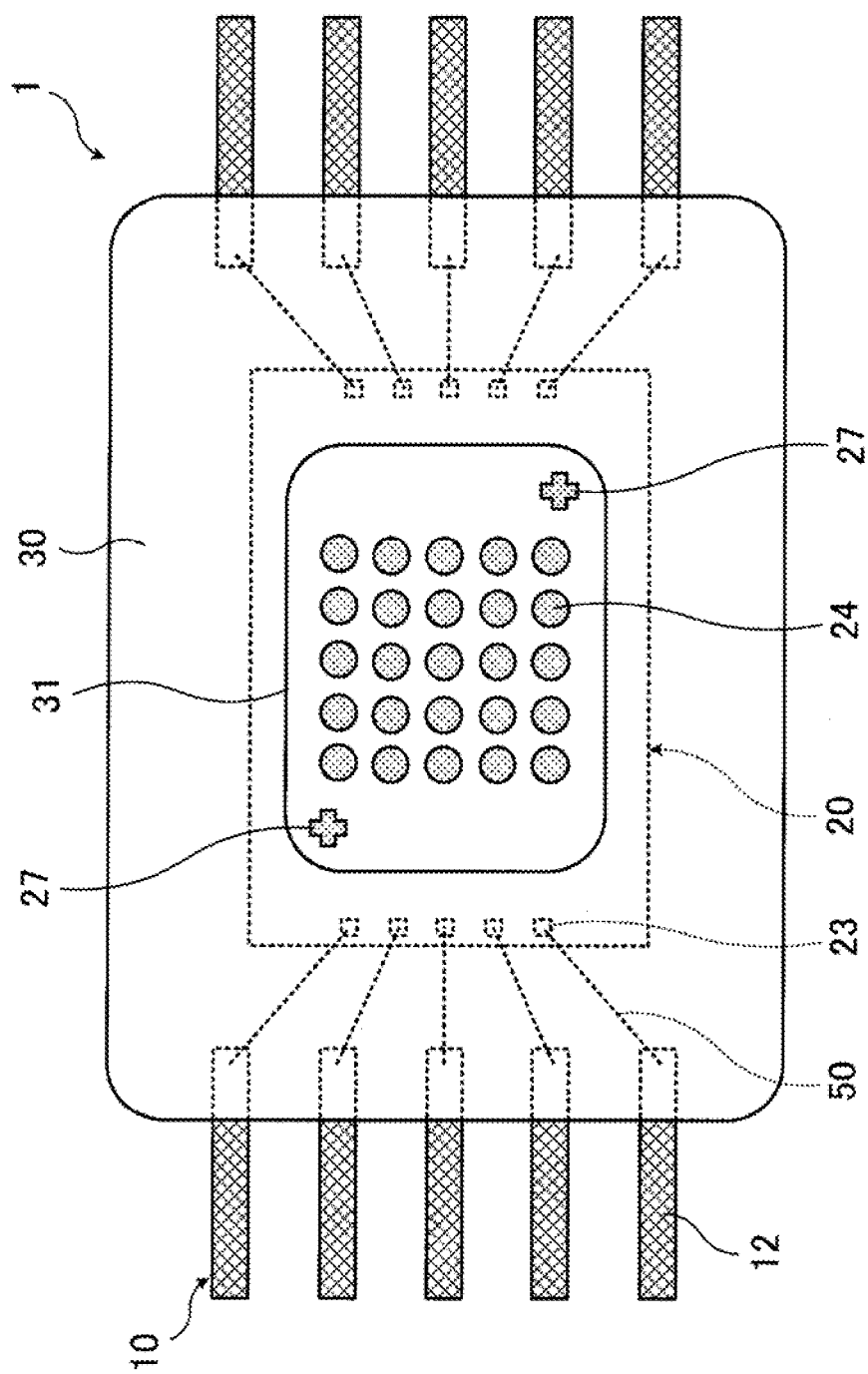
FIG. 29 illustrates an example of a semiconductor package according to a fourth embodiment.

FIG. 29 illustrates an example of a semiconductor package according to the fourth embodiment. Here, FIG. 29 is a schematic plan view of the example of the semiconductor package according to the fourth embodiment.

As illustrated in FIG. 29, in the semiconductor package 1, a pillar electrode 27 having a planar shape different from that of the pillar electrode 24 may be provided on the outer side (outer region) of the region where the pillar electrodes 64 are provided (inner region). The pillar electrode 27 may be formed on the semiconductor chip 20 together with the pillar electrodes 24 in the inner region, according to the above examples of FIG. 4 to FIG. 9.

The pillar electrode 27 in the outer region may be used as an alignment mark when the semiconductor chip 60 is mounted on the semiconductor package 1. By using the pillar electrode 27 as the alignment mark, it becomes possible to precisely bond the pillar electrodes 24 and the pillar electrodes 64 facing each other in the inner region, when the semiconductor chip 60 is mounted on the semiconductor package 1.

Note that, FIG. 29 illustrates the semiconductor package 1 in which the groove 32 is not provided in the resin 30. The pillar electrode 27 used as the alignment mark may be also applied to the semiconductor package 1 in which the groove 32 is provided in the resin 30 corresponding to the corner of the semiconductor chip 60 to be mounted and to the semiconductor package 1 in which the groove 32 is provided in the resin 30 corresponding to the side of the semiconductor chip 60 to be mounted.

Figure 30:
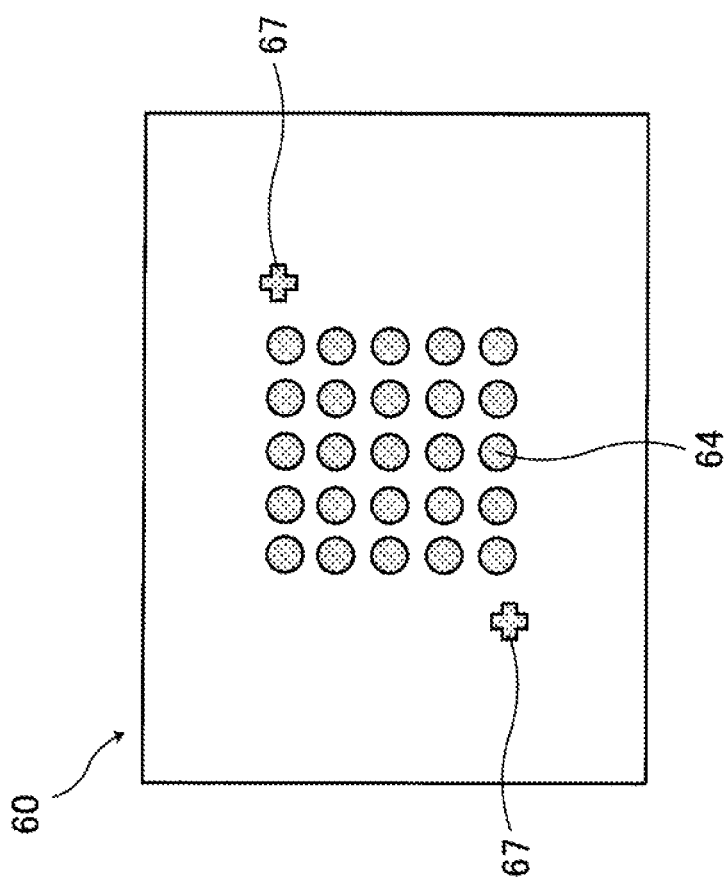
FIG. 30 illustrates an example of a semiconductor chip according to the fourth embodiment.
Figure 31:
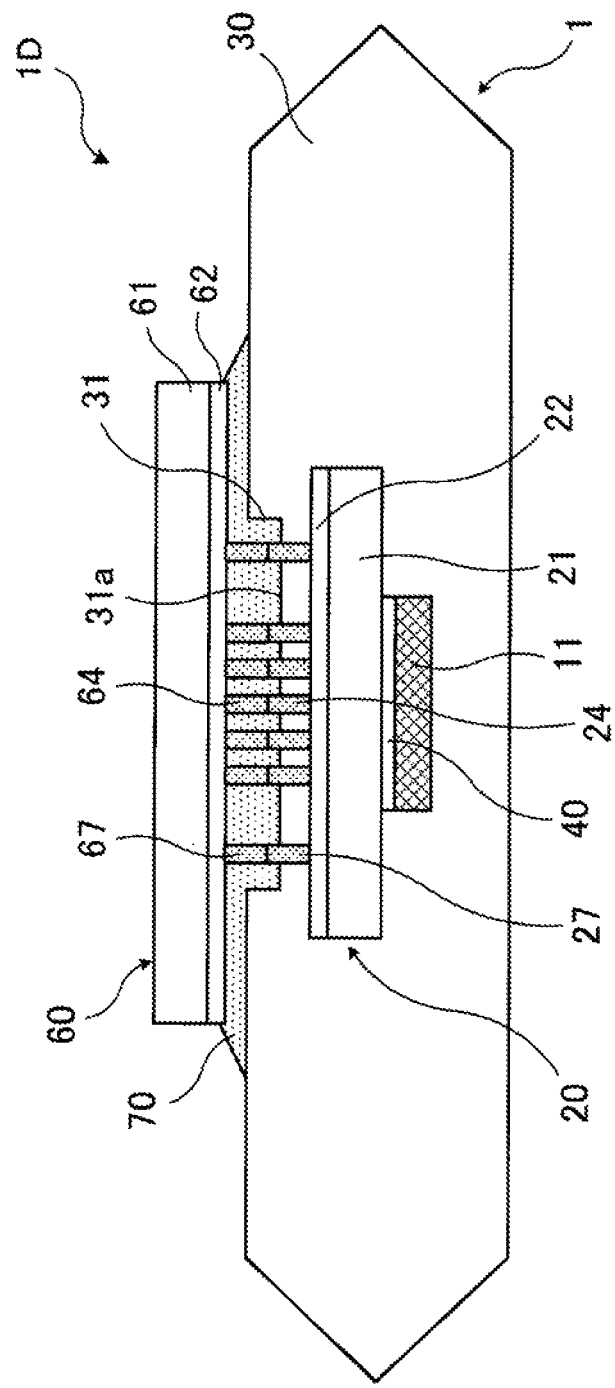
FIG. 31 illustrates an example of a semiconductor device according to the fourth embodiment.

FIG. 30 illustrates an example of a semiconductor chip according to the fourth embodiment, and FIG. 31 illustrates an example of a semiconductor device according to the fourth embodiment. Here, FIG. 30 is a schematic plan view of the example of the semiconductor chip according to the fourth embodiment when viewed from the pillar electrode side, and FIG. 31 is a schematic cross-sectional view of the example of the semiconductor device according to the fourth embodiment along a line passing through an alignment mark.

As illustrated in FIG. 30, in the semiconductor chip 60 mounted on the semiconductor package 1, for example, the semiconductor package 1 as illustrated in FIG. 29, a pillar electrode 67 having a planar shape different from that of the pillar electrode 64 may be provided on the outer side (outer region) of the region where the pillar electrodes 64 are provided (inner region). For example, the pillar electrode 67 having the same shape as the pillar electrode 27 is provided at a position corresponding to the pillar electrode 27 which is provided as the alignment mark in the semiconductor package 1 as illustrated in above FIG. 29.

The pillar electrode 67 may be used as an alignment mark when the semiconductor chip 60 is mounted on the semiconductor package 1. That is, as illustrated in FIG. 31, the semiconductor chip 60 is disposed on the semiconductor package 1 so as to align the pillar electrode 27 and the pillar electrode 67 in the outer region with each other, and the pillar electrodes 24 and the pillar electrodes 64 facing each other in the inner region are bonded to each other. By using the pillar electrodes 24 and the pillar electrodes 64 as the alignment marks, it becomes possible to precisely bond the pillar electrodes 24 and the pillar electrodes 64 to each other in the inner regions.

Further, as illustrated in FIG. 31, by bonding the pillar electrode 27 and the pillar electrode 67 provided as the alignment marks in the outer region, it becomes possible to use these pillar electrodes as a reinforcing part and to bond the semiconductor package 1 and the semiconductor chip 60 more firmly.

After the semiconductor package 1 and the semiconductor chip 60 are bonded to each other, the under-fill material 70 is filled therebetween and a semiconductor device 1D is formed.

Next, a fifth embodiment will be explained.

Figure 32:
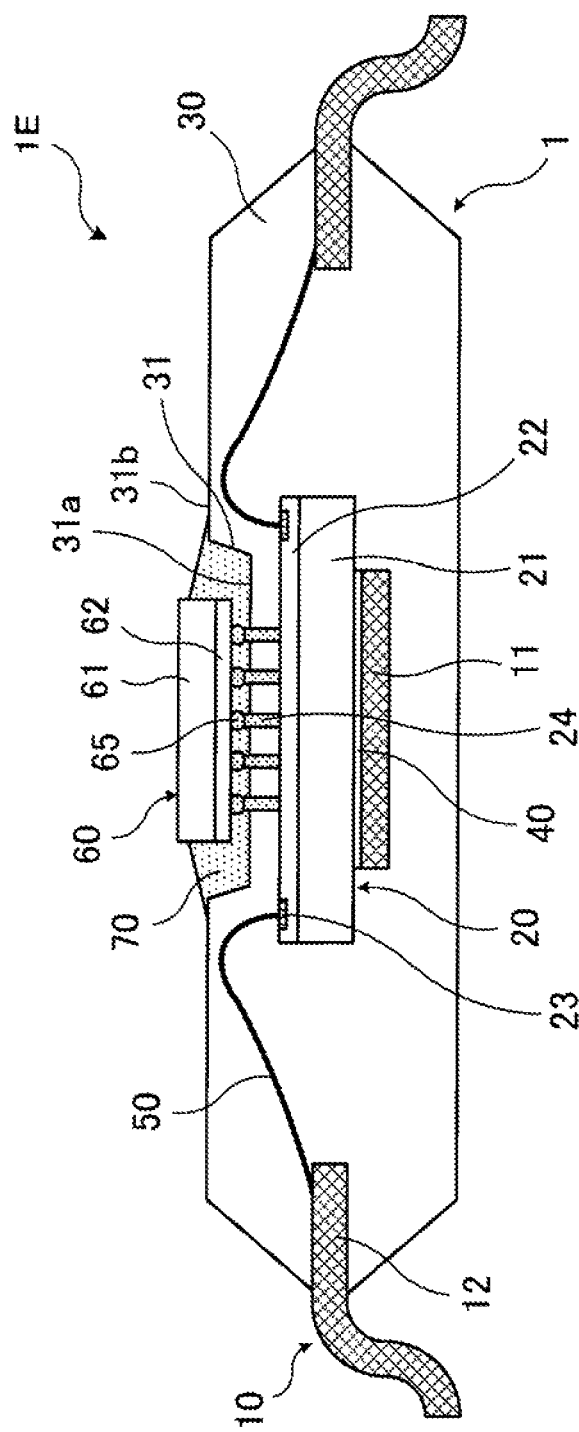
FIG. 32 illustrates an example of a semiconductor device according to the fifth embodiment.

FIG. 32 illustrates an example of a semiconductor device according to the fifth embodiment. Here, FIG. 32 is a schematic cross-sectional view of the example of the semiconductor device according to the fifth embodiment.

A semiconductor device 1E illustrated in FIG. 32 is different from the semiconductor device 1A according to the above first embodiment in the point that the semiconductor package 1 mounts the semiconductor chip 60 which has a smaller planar size than the semiconductor chip 20 incorporated in the semiconductor package 1.

The semiconductor device 1E is formed as follows: the semiconductor chip 20 is mounted on the die bonding stage 11 of the lead frame 10; then, the electrode pad 23 and the lead terminal 12 are connected with each other by the wire 50; the resin 30 having the concave part 31 is formed; and the semiconductor chip 60 is flip-chip connected.

For the semiconductor chip 60 in this semiconductor device 1E illustrated in FIG. 32, a bump 65 such as a solder ball is provided at a position corresponding to the pillar electrode 24 on the semiconductor chip 20 of the semiconductor package 1. In the resin 30 of the semiconductor package 1, the concave part 31 is provided having a larger size than the semiconductor chip 60. The semiconductor chip 60 is connected electrically to the semiconductor chip 20, with the bump 65 being bonded to the pillar electrode 24 in the concave part 31. The under-fill material 70 is filled between the semiconductor package 1 and the semiconductor chip 60.

In the semiconductor device 1E, it becomes possible to position a part of the semiconductor chip 60 on the side where the bump 65 is disposed, within the concave part 31 of the semiconductor package 1. In other words, it becomes possible to mount the semiconductor chip such that the surface of the wiring layer 62 in the semiconductor chip 60 is positioned between the bottom face 31a and the upper end 31b of the concave part 31 in the semiconductor package 1. Thereby, it becomes possible to realize the semiconductor device 1E in which the height increase due to the mounting of the semiconductor chip 60 is suppressed.

Figure 33:
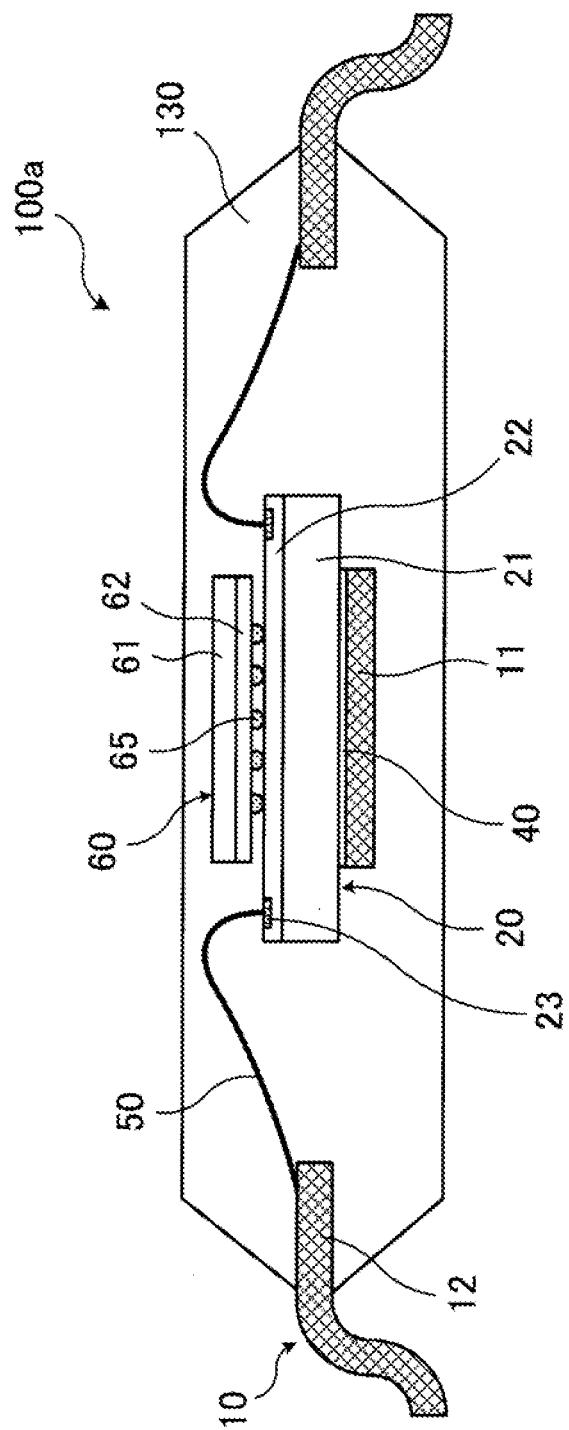
FIG. 33 illustrates an example of a semiconductor device of another mode.

Here, an example as illustrated in FIG. 33 will be considered as a semiconductor device provided with the semiconductor chip 20 and the semiconductor chip 60 which has a smaller planar size than the semiconductor chip 20.

FIG. 33 illustrates an example of a semiconductor device of another mode.

A semiconductor device 100a illustrated in FIG. 33 includes the lead frame 10, the semiconductor chip 20 mounted on the lead frame 10, the wire 50 connecting the lead frame 10 and the semiconductor chip 20, and the semiconductor chip 60 flip-chip connected on the semiconductor chip 20. The semiconductor device 100a has a structure in which resin 130 covers the lead frame 10 except a part of the lead terminal 12, the semiconductor chip 20, the wire 50, and the semiconductor chip 60.

The semiconductor device 100a is formed as follows: the semiconductor chip 20 is mounted on the die bonding stage 11 of the lead frame 10; then the semiconductor chip 60 is flip-chip connected thereon; and the electrode pad 23 and the lead terminal 12 are connected with each other by the wire 50 and encapsulated with the resin 130. When the semiconductor chip 60 is flip-chip connected, reflow using flux, for example, is performed to bond the bump 65 to the semiconductor chip 20. When acid-based material or rosin-based material is used as the flux, however, when such flux remains at the electrode pad 23 or the connection part between the electrode pad 23 and the wire 50, alloying process is promoted in the connection part of the wire 50 and failure of the connection part could be accelerated.

On the other hand, in the semiconductor device 1E of above FIG. 32, the electrode pad 23 of the semiconductor chip 20 on the lead frame 10 is connected to the lead terminal 12 with the wire 50 and the semiconductor chip 60 is flip-chip connected after the resin 30 having the concave part 31 is formed. Therefore, when the semiconductor chip 60 is flip-chip connected, even when the bump 65 is bonded to the pillar electrode 24 of the semiconductor chip 20 by means of performing the reflow using the flux of the acid-based material or rosin-based material, it is possible to suppress remaining of the flux and occurrence of problem thereby as described above.

Note that, while FIG. 32 illustrates the case of mounting the semiconductor chip 60 provided with the bump 65 onto the semiconductor package 1, it is also possible to mount the semiconductor chip 60 provided with the pillar electrode 64 onto the semiconductor package 1.

Next, a sixth embodiment will be explained.

Figure 34:
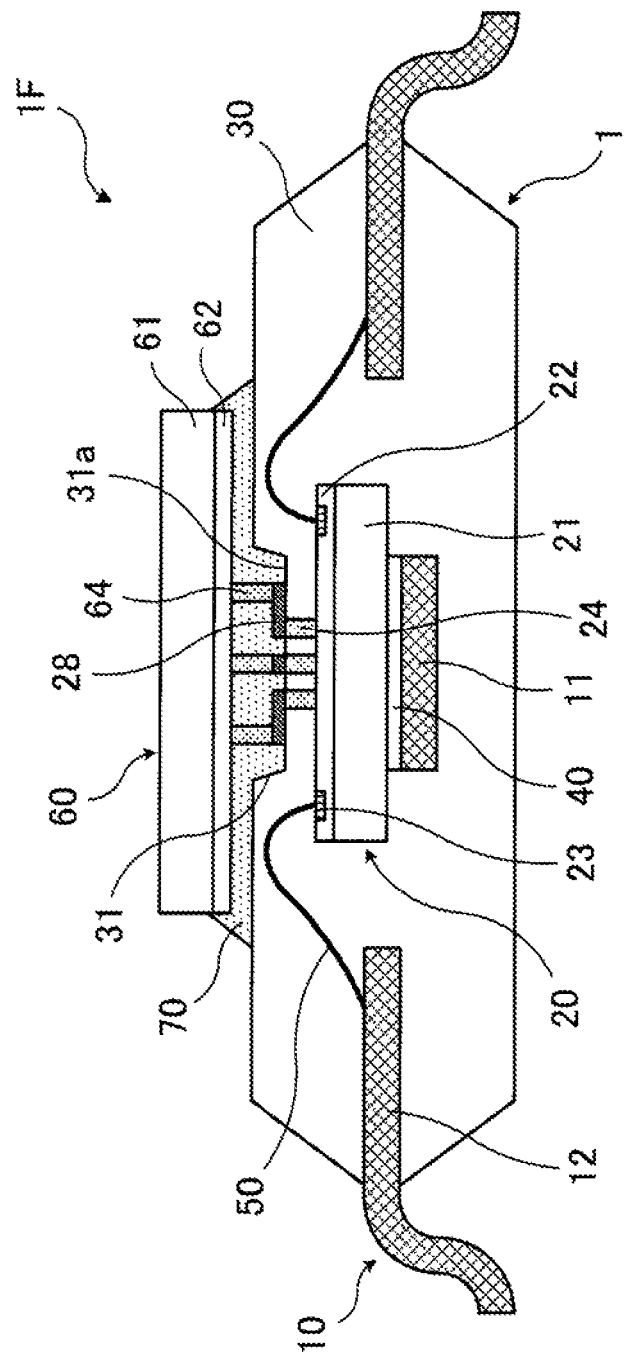
FIG. 34 illustrates an example of a semiconductor device according to a sixth embodiment.

FIG. 34 illustrates an example of a semiconductor device according to the sixth embodiment. Here, FIG. 34 is a schematic cross-sectional view of the example of the semiconductor device according to the sixth embodiment.

The semiconductor package 1 of a semiconductor device 1F illustrated in FIG. 34 has a structure in which a rewiring 28 is provided in the concave part 31 of the resin 30 thereof and connected to the pillar electrode 24 of the semiconductor chip 20. The rewiring 28 is connected with the pillar electrode 64 of the semiconductor chip 60, the under-fill material 70 is filled between the semiconductor package 1 and the semiconductor chip 60, and the semiconductor device 1F is formed. The semiconductor device 1F illustrated in FIG. 34 is different from the semiconductor device 1A according to the above first embodiment in such a point.

For example, the rewiring 28 may be formed by means of forming resist having a pattern (opening part) for the rewiring 28 to be formed and performing plating using the resist as a mask, after the concave part 31 is provided in the resin 30 exposing the pillar electrode 24.

By providing the rewiring 28 in the concave part 31, it becomes possible to increase degree of freedom in the semiconductor chip 60 to be mounted on the semiconductor package 1, for example, degree of freedom in the kind of the semiconductor chip 60 to be used and degree of freedom in arrangement (design) of the conductor parts in the wiring layer 62 and the pillar electrodes 64 in the semiconductor chip 60.

Here, according to the examples of the above second and third embodiments, in the resin 30 of the semiconductor package 1 of the semiconductor device 1F, the groove 32 communicated with the concave part 31 may be provided corresponding to the corner or the side of the semiconductor chip 60 to be mounted.

Further, according to the example of the above fourth embodiment, the semiconductor package 1 and the semiconductor chip 60 of the semiconductor device 1F may be provided with the pillar electrode 27 and the pillar electrode 67, respectively, as the alignment marks.

Further, according to the example of the above fifth embodiment, the semiconductor chip 60 to be mounted on the semiconductor package 1 of the semiconductor device 1F may have a smaller planar size than the semiconductor chip 20 and the resin 30 may be provided with the concave part 31 larger than the semiconductor chip 60 as described above.

Next, a seventh embodiment will be explained.

Figure 35:
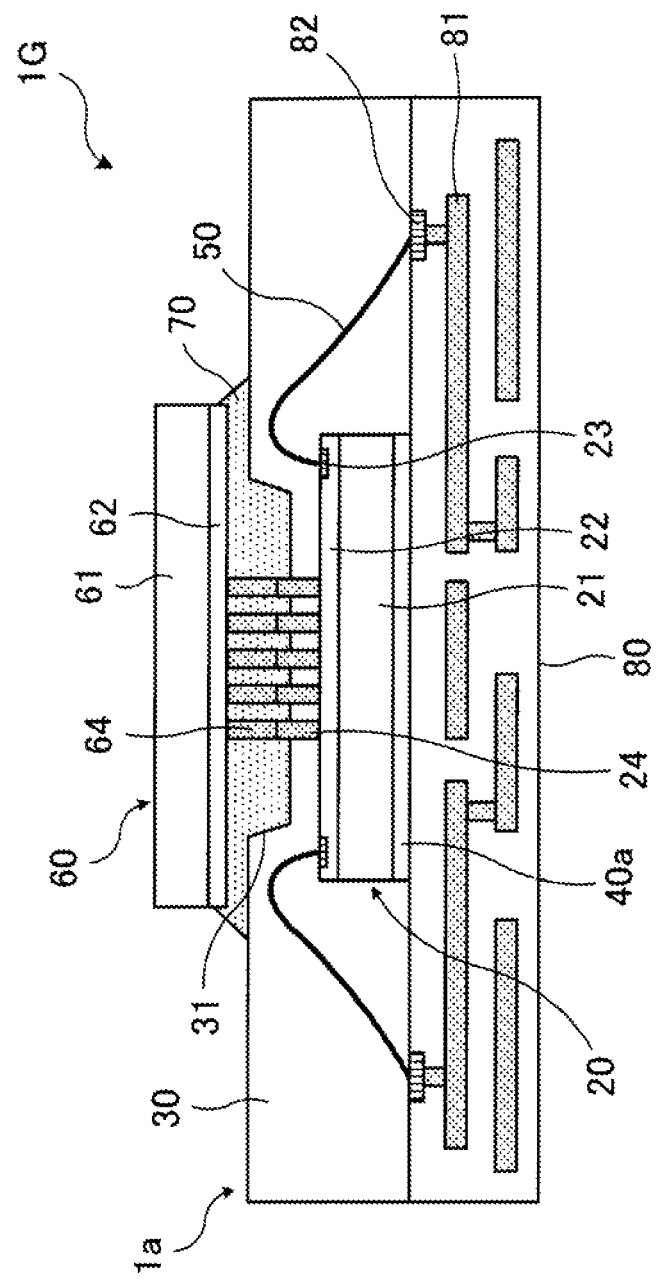
FIG. 35 illustrates an example of a semiconductor device according to a seventh embodiment.

FIG. 35 illustrates an example of a semiconductor device according to the seventh embodiment. Here, FIG. 35 is a schematic cross-sectional view of the example of the semiconductor device according to the seventh embodiment.

A semiconductor device 1G illustrated in FIG. 35 has a semiconductor package 1a in which the semiconductor chip 20 is mounted on a package substrate 80. The package substrate 80 is provided with conductor parts including a desired wiring pattern and via and electrode pads 82 connected electrically to the conductor parts 81. The semiconductor chip 20 is provided with the pillar electrodes 24. The semiconductor chip 20 is mounted on the package substrate 80 by the use of a bonding layer 40a of conductive paste or the like and the electrode pad 23 thereof is connected to the electrode pad 82 of the package substrate 80 with the wire 50. On the package substrate 80 which mounts the semiconductor chip 20, the resin 30 is provided so as to cover the semiconductor chip 20 and the wire 50. The resin 30 is provided with the concave part 31 which exposes at least the upper surface of the pillar electrode 24 of the semiconductor chip 20.

On the semiconductor package 1a as described above, the semiconductor chip 60 provided with the pillar electrodes 64 is mounted such that the pillar electrodes 64 thereof are bonded to the pillar electrodes 24 of the semiconductor chip 20. The under-fill material 70 is filled between the semiconductor package 1a and the semiconductor chip 60, and the semiconductor device 1G is formed.

By providing the concave part 31 in the resin 30, it becomes possible to reduce the height of the pillar electrode 24 to be formed and to realize time saving in the plating of the pillar electrode 24 and cost reduction in the semiconductor chip 20 provided with the pillar electrode 24, the semiconductor package 1a provided with the semiconductor chip 20, and the semiconductor device 1G. Further, it becomes possible to reduce the thickness of the resist in the formation of the pillar electrode 24 and to realize a finer pattern and a narrow pitch for the pillar electrodes 24.

While, here, the above embodiment illustrates the case of mounting the semiconductor chip 60 which has a larger planar size than the semiconductor chip 20, it is also possible to mount a semiconductor chip having a smaller size than the concave part 31 of the resin 30 using a bump such as a solder ball.

Further, in addition to the concave part 31, the resin 30 of the semiconductor package 1a may be provided with the groove which is communicated with the concave part 31 and extends to the outside of the semiconductor chip 60, and the under-fill material 70 may be introduced from the groove.

Note that, according to the examples of the above second and third embodiments, the groove 32 which is communicated with the concave part 31 may be provided in the resin 30 of the semiconductor package 1a of the semiconductor device 1G, corresponding to the corner or the side of the semiconductor chip 60 to be mounted.

Further, according to the example of the above fourth embodiment, the semiconductor package 1a and the semiconductor chip 60 in the semiconductor device 1G may be provided with the pillar electrode 27 and the pillar electrode 67, respectively, as the alignment marks.

Further, according to the example of the above fifth embodiment, the semiconductor chip 60 to be mounted on the semiconductor package 1a of the semiconductor device 1G may have a smaller planar size than the semiconductor chip 20 and the concave part 31 having a larger size than the semiconductor chip 60 as described above may be provided in the resin 30.

According to the disclosed techniques, it becomes possible to suppress increase in the height of the protruding electrode to be exposed from the resin, and to realize the protruding electrodes having fine patterns or a narrow pitch and the semiconductor device which is provided with such protruding electrodes, efficiently and in a low cost.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
    a first substrate;
    resin that covers the first substrate;
    a concave part provided in the resin; and
    a first electrode with a protruding shape, that is provided on the first substrate and includes a part exposed from the resin at a bottom face of the concave part; wherein
    the resin includes a part different from the concave part,
    the first electrode is located at an inner position than a side wall of the concave part, and
    an upper surface of the first electrode is located at a lower position than an upper surface of the part different from the concave part of the resin.

2. The semiconductor device according to claim 1, wherein the first electrode includes:
    a first part that includes a first conductor; and
    a second part that is located on the first part and includes a second conductor different from the first conductor.

3. The semiconductor device according to claim 2, wherein the part exposed from the resin is the second part, and
    the first part is covered by the resin.

4. The semiconductor device according to claim 2, wherein the first conductor includes copper and the second conductor includes solder.

5. The semiconductor device according to claim 1, further comprising:
    a pad provided on the first substrate;
    a lead frame, that is partially provided within the resin; and
    a wire that is provided within the resin, the wire including one end connected to the pad and another end connected to the lead frame and being partially located at a higher position than the bottom face of the concave part.

6. The semiconductor device according to claim 1, further comprising:
    a pad provided on the first substrate;
    a lead frame, that is partially provided within the resin; and
    a wire that is provided within the resin, the wire including one end connected to the pad and another end connected to the lead frame and being partially located at a higher position than the first electrode.

7. The semiconductor device according to claim 1, further comprising:
    a second substrate, and
    a second electrode that is provided on the second substrate and connected to the first electrode within the concave part.

8. The semiconductor device according to claim 7, further comprising an insulating layer, that covers the first electrode and the second electrode, provided in the concave part,
    wherein the second electrode has a protruding shape.

9. The semiconductor device according to claim 7,
    wherein the second substrate is smaller than the concave part in a plan view, and
    wherein a face of the second substrate where the second electrode is provided is located between an upper end and the bottom face of the concave part in the resin.

10. The semiconductor device according to claim 1, comprising a groove which is provided in the resin and communicated with the concave part.

11. The semiconductor device according to claim 1, wherein the upper surface of the first electrode is located at a higher position than the bottom face of the concave part.

* * * * *